(12) United States Patent
Mabuchi

(10) Patent No.: US 8,785,991 B2
(45) Date of Patent: Jul. 22, 2014

(54) SOLID STATE IMAGING DEVICE, METHOD FOR PRODUCING THE SAME, AND ELECTRONIC APPARATUS

(75) Inventor: Keiji Mabuchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 362 days.

(21) Appl. No.: 12/453,954

(22) Filed: May 28, 2009

(65) Prior Publication Data

US 2010/0002108 A1 Jan. 7, 2010

(30) Foreign Application Priority Data

Jul. 2, 2008 (JP) ................................. 2008-173626

(51) Int. Cl.
*H01L 31/113* (2006.01)
(52) U.S. Cl.
USPC ........... 257/291; 257/290; 257/292; 257/293; 257/294; 257/432; 257/461; 257/436; 257/232; 438/48; 438/73; 438/79; 438/57
(58) Field of Classification Search
CPC ..................... H01L 27/1463; H01L 27/14609; H01L 27/14643; H01L 27/1464; H01L 23/147; H01L 27/146; H01L 29/105; H01L 31/0232; H01L 31/14603; H01L 31/14689; H01L 31/14621; H01L 31/14643; H01L 31/14627
USPC .................................................... 257/290–294
See application file for complete search history.

(56) References Cited

U.S. PATENT DOCUMENTS

| | | | | |
|---|---|---|---|---|
| 5,633,526 | A * | 5/1997 | Kudo et al. | 257/431 |
| 6,204,087 | B1 * | 3/2001 | Parker et al. | 438/56 |
| 7,432,121 | B2 * | 10/2008 | Brady et al. | 438/48 |
| 7,723,766 | B2 * | 5/2010 | Shinohara et al. | 257/292 |
| 2004/0262622 | A1 * | 12/2004 | Patrick | 257/79 |
| 2006/0027888 | A1 * | 2/2006 | Yoshihara | 257/440 |
| 2007/0131991 | A1 * | 6/2007 | Sugawa | 257/292 |
| 2008/0296641 | A1 * | 12/2008 | Kim | 257/292 |
| 2012/0267692 | A1 * | 10/2012 | Suzuki et al. | 257/225 |

FOREIGN PATENT DOCUMENTS

| | | |
|---|---|---|
| JP | 2003-318383 | 11/2003 |
| JP | 2005-191262 | 7/2005 |
| JP | 2005-223084 | 8/2005 |

* cited by examiner

*Primary Examiner* — Fernando L Toledo
*Assistant Examiner* — Mohammed Shamsuzzaman
(74) *Attorney, Agent, or Firm* — Rader, Fishman & Grauer PLLC

(57) ABSTRACT

A solid state imaging device includes a photoelectric conversion portion in which the shape of potential is provided such that charge is mainly accumulated in a vertical direction.

16 Claims, 25 Drawing Sheets

130

SOLID STATE IMAGING DEVICE, METHOD FOR PRODUCING THE SAME, AND ELECTRONIC APPARATUS

BACKGROUND OF THE INVENTION

1. Field of the Invention

The present invention relates to a solid state imaging device, a method for producing the solid state imaging device, and an electronic apparatus including the solid state imaging device.

2. Description of the Related Art

Solid state imaging devices are broadly divided into charge-transfer-type solid state imaging devices represented by CCD (charge coupled device) image sensors and amplification-type solid state imaging devices represented by CMOS (complementary metal oxide semiconductor) image sensors.

CMOS solid state imaging devices are operable at low power supply voltage and hence advantageous in view of power consumption compared with CCD solid state imaging devices. For this reason, CMOS solid state imaging devices are used as solid state imaging devices mounted on mobile apparatuses such as camera-equipped cellular phones and PDAs (personal digital assistants).

A photodiode serving as a photoelectric conversion portion constituting a pixel of a solid state imaging device and using electrons as signal charge is constituted by an n-type semiconductor region and a p-type semiconductor region on the surface of the n-type semiconductor region. As disclosed in Japanese Unexamined Patent Application Publication No. 2005-191262, an existing photodiode of a solid state imaging device is typically constituted by a p-type semiconductor region having a high impurity concentration in the top surface (interface) of a p-type semiconductor well region of a semiconductor substrate and an n-type semiconductor region under the p-type semiconductor region. Such a photodiode accumulates charge generated by photoelectric conversion at pn junction capacitance between the p-type semiconductor region and the n-type semiconductor region, that is, at depletion-layer capacitance. To isolate neighboring pixels from each other, for example, a device isolation region is used that is formed by filling a trench with an insulation film. In this case, a p-type semiconductor region is used to protect the interface between the photodiode and the insulation film.

Japanese Unexamined Patent Application Publication No. 2003-318383 also discloses a photodiode serving as a photoelectric conversion portion in a solid state imaging device. A photodiode of a CCD solid state imaging device in Japanese Unexamined Patent Application Publication No. 2003-318383 is constituted by an n-type semiconductor region and a p-type semiconductor region on the top surface of the n-type semiconductor region. This p-type semiconductor region is constituted by a first p-type semiconductor region and a second p-type semiconductor region. The first p-type semiconductor region is formed on the whole surface of the n-type semiconductor region. The second p-type semiconductor region is formed so as to have a smaller width than that of the n-type semiconductor region and is formed deeper than the first p-type semiconductor region. Such a two-level structure of the p-type semiconductor region results in mild variation in field intensity at the interface between the p-type semiconductor region and a vertical transfer region. Thus, charge can be efficiently transferred to the vertical transfer region.

Japanese Unexamined Patent Application Publication No. 2005-223084 discloses a CMOS solid state imaging device having a configuration in which a vertical transistor is used as a transfer transistor among pixel transistors. This CMOS solid state imaging device has a floating diffusion (FD) portion over a photodiode and a transfer gate electrode is formed over the FD portion with a gate insulation film therebetween so as to extend in the depth direction of a substrate.

SUMMARY OF THE INVENTION

With the recent trend toward smaller pixels in solid state imaging devices, it has become difficult to provide a sufficiently large area for photodiodes. The ratio of the area of photodiodes to the area of pixels in a CMOS solid state imaging device is referred to as fill factor. Providing a sufficiently high fill factor is now a technical challenge. With the trend toward markedly smaller pixels, a fill factor of 100% in theory does not actually provide a sufficiently large area for photodiodes. Since transistor circuits including pixel transistors are formed in pixels, formation of photodiodes becomes more difficult as the size of pixels is reduced.

Accordingly, the present invention provides a solid state imaging device in which a sufficiently large saturation amount of charge can be provided in a photoelectric conversion portion even when pixels having a reduced size are used; and a method for producing such a solid state imaging device.

The present invention also provides an electronic apparatus including such a solid state imaging device.

A solid state imaging device according to an embodiment of the present invention includes a photoelectric conversion portion in which a shape of potential is provided such that charge is mainly accumulated in a vertical direction. A solid state imaging device according to an embodiment of the present invention includes a photoelectric conversion portion in which a shape of potential is provided such that charge is mainly accumulated in a vertical direction. Thus, the solid state imaging device includes the photoelectric conversion portion having a vertical configuration. In this configuration, the saturation amount of charge in the photoelectric conversion portion constituting a pixel is increased.

A method for producing a solid state imaging device according to an embodiment of the present invention includes the steps of: forming a second-conductivity-type semiconductor region in an area of a semiconductor substrate by a plurality of ion implantations with different implantation energy via a mask; and forming a photoelectric conversion portion configured to accumulate more charge in a pn junction parallel to a plane in a depth direction of the semiconductor substrate than in a pn junction formed in a plane parallel to a top surface of the semiconductor substrate by forming a first-conductivity-type semiconductor region in the second-conductivity-type semiconductor region by a plurality of ion implantations with different implantation energy.

In this method for producing a solid state imaging device according to an embodiment of the present invention, the photoelectric conversion portion is formed by forming the second-conductivity-type semiconductor region and the first-conductivity-type semiconductor region by a plurality of ion implantations with different implantation energy. As a result, the photoelectric conversion portion is formed that is configured to accumulate more charge in a pn junction parallel to a plane in a depth direction of the semiconductor substrate than in a pn junction formed in a plane parallel to a top surface of the semiconductor substrate. That is, the photoelectric conversion portion having a vertical configuration is formed. Such a photoelectric conversion portion has a large saturation amount of charge.

A method for producing a solid state imaging device according to another embodiment of the present invention includes the steps of: forming a recess in an area of a semiconductor substrate; forming a second-conductivity-type semiconductor region by diffusing a second-conductivity-type impurity through an inner surface of the recess; and forming a photoelectric conversion portion configured to accumulate more charge in a pn junction parallel to a plane in a depth direction of the semiconductor substrate than in a pn junction formed in a plane parallel to a top surface of the semiconductor substrate by forming a first-conductivity-type semiconductor region in the second-conductivity-type semiconductor region by diffusing a first-conductivity-type impurity through the inner surface of the recess.

In this method for producing a solid state imaging device according to an embodiment of the present invention, the photoelectric conversion portion is formed by forming a recess in an area of a semiconductor substrate and forming the second-conductivity-type semiconductor region and the first-conductivity-type semiconductor region by diffusion through the inner surface of the recess. As a result, the photoelectric conversion portion is formed that is configured to accumulate more charge in a pn junction parallel to a plane in a depth direction of the semiconductor substrate than in a pn junction formed in a plane parallel to a top surface of the semiconductor substrate. That is, the photoelectric conversion portion having a vertical configuration is formed. Such a photoelectric conversion portion has a large saturation amount of charge.

An electronic apparatus according to an embodiment of the present invention includes a solid state imaging device including a photoelectric conversion portion in which a shape of potential is provided such that charge is mainly accumulated in a vertical direction; an optical system configured to guide an incoming light to the photoelectric conversion portion of the solid state imaging device; and a signal processing circuit configured to process signals output from the solid state imaging device.

An electronic apparatus according to an embodiment of the present invention includes a solid state imaging device including a photoelectric conversion portion in which a shape of potential is provided such that charge is mainly accumulated in a vertical direction, that is, a photoelectric conversion portion having a vertical configuration. Such a photoelectric conversion portion constituting a pixel has an increased saturation amount of charge.

A solid state imaging device according to an embodiment of the present invention includes a photoelectric conversion portion having a vertical configuration. A sufficiently large saturation amount of charge can be provided in such a photoelectric conversion portion even when pixels having a reduced size are used.

In a method for producing a solid state imaging device according to an embodiment of the present invention, a photoelectric conversion portion having a vertical configuration is formed. As a result, a solid state imaging device can be produced in which a sufficiently large saturation amount of charge can be provided in the photoelectric conversion portion even when pixels having a reduced size are used.

In an electronic apparatus according to an embodiment of the present invention, a sufficiently large saturation amount of charge can be provided in the photoelectric conversion portion even when pixels of a solid state imaging device have a reduced size. As a result, a sufficiently wide dynamic range is provided and higher image quality is provided.

DESCRIPTION OF THE PREFERRED EMBODIMENTS

Hereinafter, embodiments of the present invention are described with reference to drawings.

Schematic Configuration According to Embodiment of Solid State Imaging Device

Figure 1:
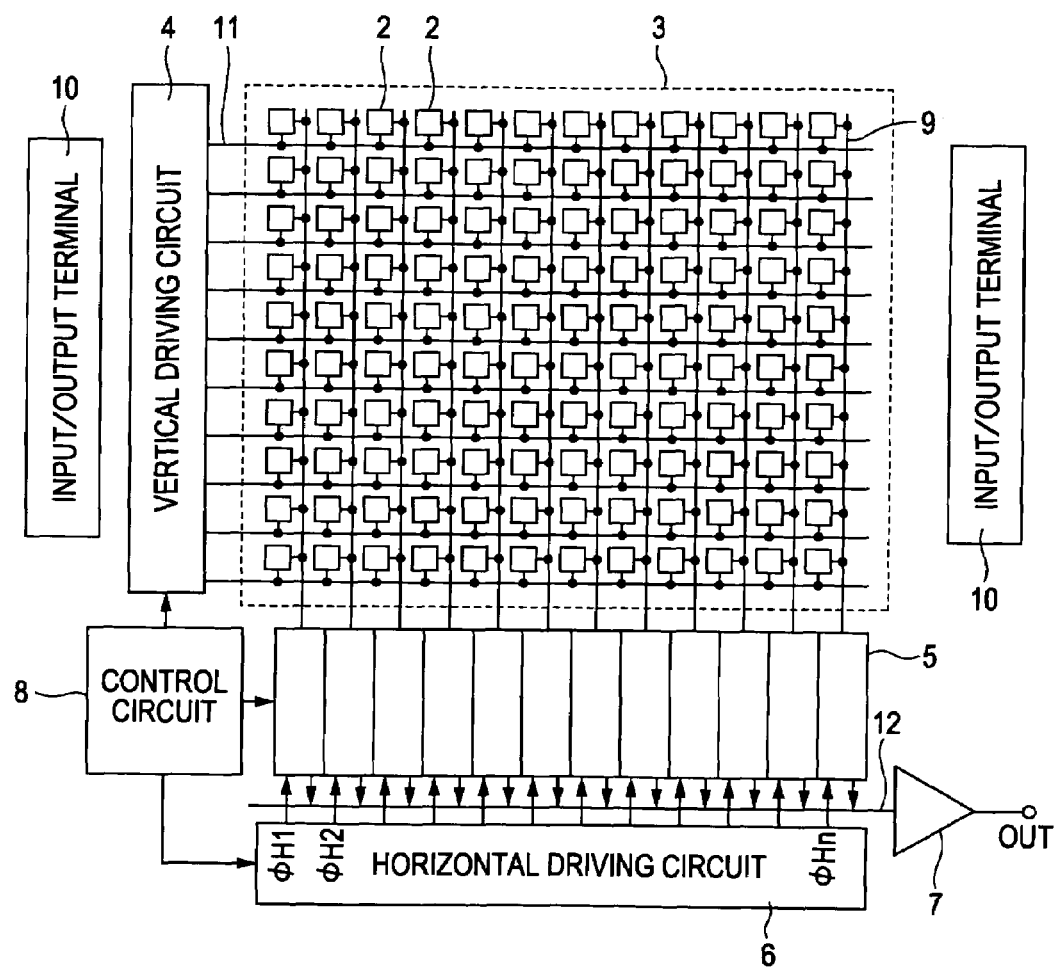
FIG. 1 shows the schematic configuration of a solid state imaging device according to an embodiment of the present invention.

FIG. 1 shows the schematic configuration of a solid state imaging device according to an embodiment of the present invention, that is, a CMOS solid state imaging device. A solid state imaging device 1 of this embodiment includes a semiconductor substrate (for example, a silicon substrate), a pixel array region (that is, image pickup region) 3 in which pixels 2 including a plurality of photoelectric conversion portions are regularly arrayed in two dimensions on the semiconductor substrate, and peripheral circuits. As described below, the pixels 2 include photodiodes (PDs) serving as photoelectric conversion portions and a plurality of pixel transistors (MOS transistors).

The peripheral circuits include a vertical driving circuit 4, column signal processing circuits 5, a horizontal driving circuit 6, an output circuit 7, a control circuit 8, and the like.

The control circuit 8 receives data for controlling an operation mode of the solid state imaging device 1 and outputs data including information of the solid state imaging device 1. The control circuit 8 also generates clock signals and control signals on the basis of vertical sync signals, horizontal sync signals, and a master clock, the clock signals and the control signals serving as references for operations of the vertical driving circuit 4, the column signal processing circuits 5, the horizontal driving circuit 6, and the like. The clock signals and the control signals are input to the vertical driving circuit 4, the column signal processing circuits 5, the horizontal driving circuit 6, and the like.

The pixel array region 3 includes row control wires 11 provided in the lateral direction (horizontal direction) of FIG. 1 and vertical signal wires 9 provided in the longitudinal direction (vertical direction) of FIG. 1. The row control wires 11 are respectively provided for the rows of the pixels 2 arrayed in two dimensions. The vertical signal wires 9 are respectively provided for the columns of the pixels 2.

The vertical driving circuit 4 is constituted by, for example, a shift register. The vertical driving circuit 4 sequentially selects in the vertical direction individual rows of the pixels 2 in the pixel array region 3 and supplies control pulses to the pixels 2 of a selected row via the corresponding row control wire 11. Signals output from the pixels 2 of a selected row, that is, pixel signals based on signal charge generated in accordance with the light-receiving amount of photodiodes serving as photoelectric conversion portions of the pixels 2 are supplied to the corresponding column signal processing circuit 5 via the corresponding vertical signal wire 9.

The column signal processing circuits 5 are respectively provided for the columns of the pixels 2. Each column signal processing circuit 5 subjects signals output from the pixels 2 of a column to a process such as noise removal. Specifically, the column signal processing circuits 5 process signals by, for example, functioning as S/H (sample-and-hold) circuits and CDS (correlated double sampling) circuits or amplifying the signals for the purpose of removing fixed pattern noise specific to the pixels 2.

The input stages of the column signal processing circuits 5 include load transistors (not shown) as constant-current sources. These load transistors are connected between the vertical signal wires 9 and a reference potential, for example, ground, and the gate is connected to load wires. Thus, the load transistors constitute a source follower circuit together with amplification transistors (described below) of the pixels 2 of a selected row. As a result, signals are output to the vertical signal wires 9 from the pixels 2 of a selected row.

The output stages of the column signal processing circuits 5 include horizontal selection switches (not shown) that are connected to a horizontal signal wire 12. Note that the column signal processing circuits 5 may include an A/D (analog/digital) conversion function.

The horizontal driving circuit 6 is constituted by, for example, a shift register. The horizontal driving circuit 6 sequentially outputs horizontal scanning pulses $\phi H1$ to $\phi Hn$, thereby sequentially selecting the column signal processing circuits 5 so that pixel signals are output from the column signal processing circuits 5 to the horizontal signal wire 12.

The output circuit 7 processes signals sequentially supplied from the column signal processing circuits 5 via the horizontal signal wire 12 and outputs the resultant signals. Specifically, the output circuit 7 processes signals by, for example, only buffering signals or subjecting signals to black level adjustment, correction for variations in columns, amplification, a process involving colors, or the like before buffering the signals.

In FIG. 1, input/output terminals 10 are provided on the left side and the right side.

Equivalent Circuit of Pixel

Figure 2:
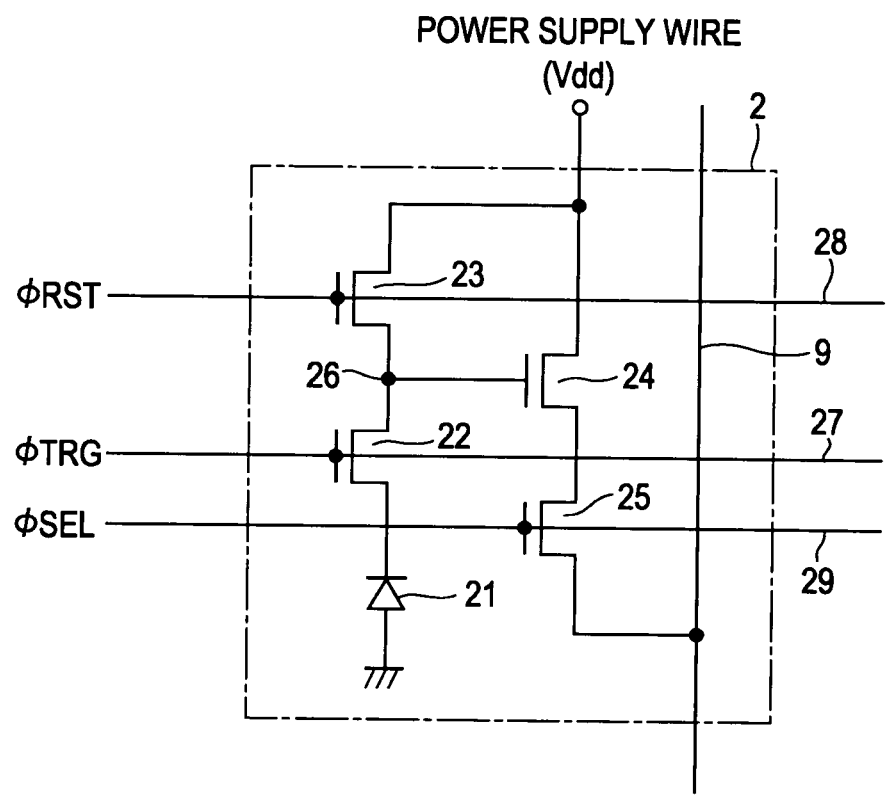
FIG. 2 shows an equivalent circuit of an example of a unit pixel.

FIG. 2 shows an example of an equivalent circuit of the pixel 2. The pixel 2 according to this circuit example includes a photodiode 21 serving as a photoelectric conversion portion and four pixel transistors 22 to 25. The four pixel transistors are constituted by a transfer transistor 22, a reset transistor 23, an amplification transistor 24, and a selection transistor 25. These pixel transistors 22 to 25 include, for example, n-channel MOS transistors.

The photodiode 21 converts light to signal charge (in this embodiment, electrons) having an amount of charge according to the amount of light received. The cathode (n-type region) of the photodiode 21 is connected to the gate of the amplification transistor 24 with the transfer transistor 22 therebetween. A node 26 that is electrically connected to the gate of the amplification transistor 24 is referred to as a FD (floating diffusion) portion.

The transfer transistor 22 is connected between the cathode of the photodiode 21 and the FD portion 26. When the transfer transistor 22 receives transfer pulses φTRG, the transfer transistor 22 enters the on state and transfers signal charge of the photodiode 21 to the FD portion 26. The FD portion 26 corresponds to the drain region of the transfer transistor 22.

As for the reset transistor 23, its drain is connected to a pixel power supply Vdd and the source of the reset transistor 23 is connected to the FD portion 26, that is, the source of the transfer transistor 22. When the gate of the reset transistor 23 receives reset pulses φRST via a reset wire 28, the reset transistor 23 enters the on state. The reset transistor 23 in the on state removes the charge of the FD portion 26 to the pixel power supply Vdd so as to reset the FD portion 26 before the transfer of signal charge from the photodiode 21 to the FD portion 26.

As for the amplification transistor 24, its gate is connected to the FD portion 26, the drain of the amplification transistor 24 is connected to the pixel power supply Vdd, and the source of the amplification transistor 24 is connected to the drain of the selection transistor 25. The amplification transistor 24 outputs, as a reset level, the potential of the FD portion 26 that has been reset by the reset transistor 23. The amplification transistor 24 also outputs, as a signal level, the potential of the FD portion 26 to which signal charge has been transferred by the transfer transistor 22.

As for the selection transistor 25, its source is connected to the vertical signal wire 9. When the gate of the selection transistor 25 receives selection pulses φSEL via a selection wire 29, the selection transistor 25 enters the on state and selects the pixel 2 and passes signals output from the amplification transistor 24 to the vertical signal wire 9.

The wires in the lateral direction, that is, a transfer wire 27, the reset wire 28, and the selection wire 29 are shared by pixels in a row and controlled by the vertical driving circuit 4. A p well wire (not shown) for fixing a potential in the p-type semiconductor well region of the pixel 2 is fixed at a ground potential.

Alternatively, another circuit configuration may be employed in which the selection transistor 25 is connected between the pixel power supply Vdd and the drain of the amplification transistor 24. In this configuration, the source of the amplification transistor 24 is connected to the vertical signal wire 9.

The pixel transistors are not restricted to the above-described four-transistor configuration and a three-transistor configuration constituted by a transfer transistor, a reset transistor, and an amplification transistor may also be employed. Alternatively, a solid state imaging device may include pixel common cells in which pixel transistors other than a plurality of transfer transistors are shared by a plurality of photodiodes, the pixel common cells being arrayed in two dimensions.

A top-surface-light-receiving-type CMOS solid state imaging device includes a multilayer wiring layer in which multilayer wiring is provided on the top surface of a substrate with an interlayer insulation film therebetween, the substrate including a pixel array formed thereon; an on-chip color filter on the multilayer wiring layer with a flattening film therebetween; and an on-chip microlens on the on-chip color filter. A light-shielding film is formed in the effective pixel region of the pixel array other than the light-receiving region and the peripheral circuit region. This light-shielding film can be formed with, for example, wiring in the uppermost layer of the multilayer wiring layer.

A bottom-surface-light-receiving-type CMOS solid state imaging device includes a multilayer wiring layer provided on the top surface of a substrate on which a pixel array is formed; and an on-chip color filter and an on-chip microlens stacked on the bottom surface of the substrate.

A solid state imaging device according to an embodiment of the present invention particularly has a feature in the configuration of the photoelectric conversion portion. Specifically, a solid state imaging device according to an embodiment of the present invention includes a photoelectric conversion portion in which the shape of the potential in the photoelectric conversion portion is provided such that charge is mainly accumulated in the depth direction of a semiconductor substrate, that is, in the vertical direction. A photoelectric conversion portion of this embodiment is constituted by a photodiode including a pn junction.

Specifically, the photoelectric conversion portion of this embodiment is configured to accumulate more charge in a pn junction parallel to a plane in the depth direction of a semiconductor substrate than in a pn junction parallel to a top surface of the semiconductor substrate.

The configuration of a solid state imaging device according to this embodiment, in particular, the configuration of a photodiode serving as the photoelectric conversion portion of the solid state imaging device, is applicable to both top-surface-light-receiving-type solid state imaging devices and bottom-surface-light-receiving-type solid state imaging devices.

Figure 3A:
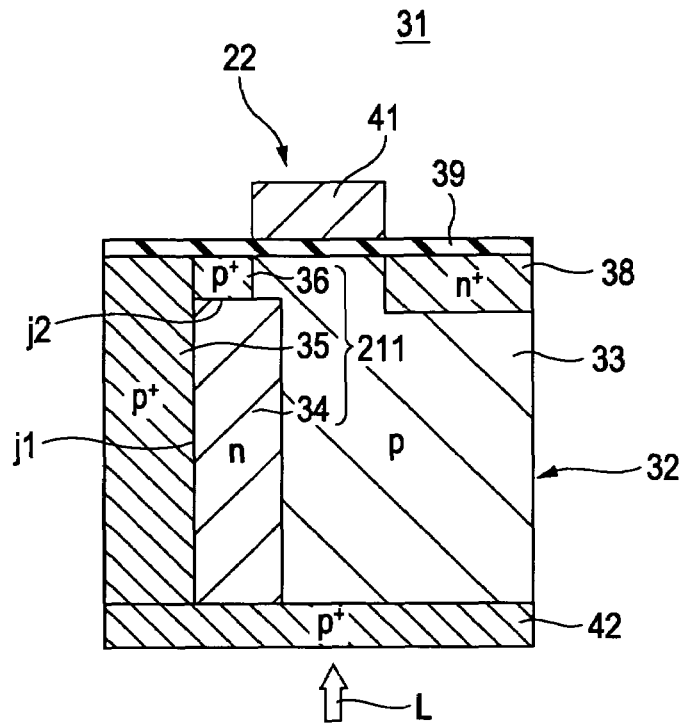
FIGS. 3A and 3B respectively show the configuration of a main part and the potential distribution of a photoelectric conversion portion according to a first embodiment (the basic configuration of a bottom-surface-light-receiving-type solid state imaging device) of the present invention.
Figure 3B:
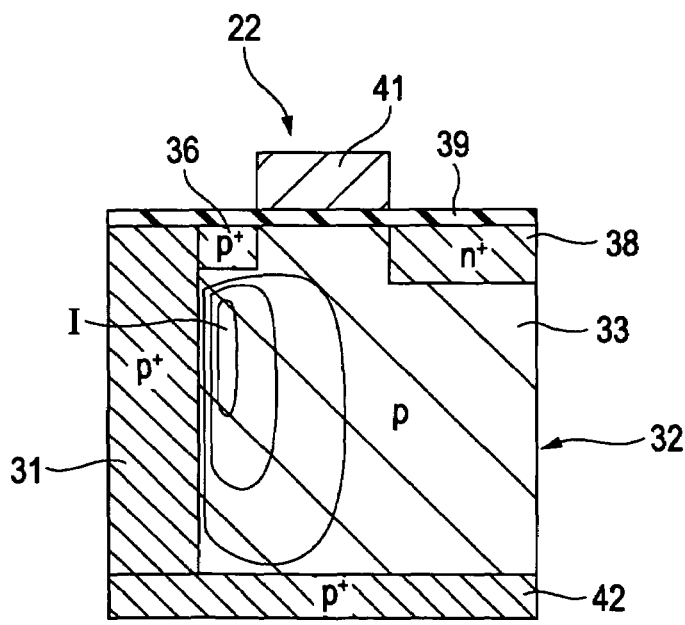

First embodiment: Basic Configuration of Bottom-Surface-Light-Receiving-Type Solid State Imaging Device FIGS. 3A and 3B show a solid state imaging device according to a first embodiment of the present invention, in particular, the basic configuration of a photodiode serving as the photoelectric conversion portion of the solid state imaging device. A solid state imaging device 31 in FIGS. 3A and 3B is a bottom-surface-light-receiving-type CMOS solid state imaging device. FIGS. 3A and 3B are section views of main parts including photodiodes and transfer transistors.

Referring to FIG. 3A, in the solid state imaging device 31 according to the first embodiment, a first-conductivity-type (for example, p-type) semiconductor well region 33 is formed in a semiconductor substrate 32 and a photodiode 211 according to the first embodiment of the present invention is formed in the p-type semiconductor well region 33. Specifically, the p-type semiconductor well region 33 includes a second-conductivity-type (for example, n-type) semiconductor region 34 that is vertically elongated in the depth direction of the substrate 32; a p-type semiconductor region 35 that is also vertically elongated and is in contact with a surface of the n-type semiconductor region 34, the surface extending in the depth direction; and a p-type semiconductor region 36 in the top surface of the p-type semiconductor well region 33. The vertically elongated p-type semiconductor region 35 contains a higher impurity concentration than that in the p-type semiconductor well region 33. The vertically elongated n-type semiconductor region 34, the vertically elongated p-type semiconductor region 35, and the p-type semiconductor region 36 in the top surface constitute the photodiode 211 of the pixel. The p-type semiconductor region 36 in the top surface suppresses dark current from the interface at the top surface of the semiconductor substrate 32.

An FD portion 38 constituted by an n-type semiconductor region is formed in the top surface of the p-type semiconductor well region 33. A transfer gate electrode 41 is formed on the substrate 32 with a gate insulation film 39 therebetween and above a region of the substrate 32 between the FD portion 38 and the photodiode 211. Thus, the transfer transistor 22 is formed. A p-type semiconductor region 42 for suppressing dark current is formed in the bottom surface of the semiconductor substrate 32. Light L is made incident on the bottom surface of the solid state imaging device 31.

Mainly due to the presence of a pn junction j1 formed by the vertically elongated n-type semiconductor region 34 and the vertically elongated p-type semiconductor region 35, the photodiode 211 includes, as a charge accumulation region, the whole region in the depth direction or a region extending in the depth direction of the n-type semiconductor region 34. In this configuration, the n-type semiconductor region 34 and the p-type semiconductor region 35 are formed so as to have substantially the same impurity concentration over the whole regions in the depth direction.

In this configuration, referring to FIG. 3B showing potential distribution, the shape of a potential I in the photodiode 211 is provided such that signal charge is mainly accumulated in the vertical plane.

The photodiode 211 includes a pn junction j2 that is parallel to the top surface of the semiconductor substrate 32 and formed between the n-type semiconductor region 34 and the p-type semiconductor region (p+ region) 36 in the top surface; and the pn junction j1 that is parallel to a plane in the depth direction of the semiconductor substrate 32 and formed between the n-type semiconductor region 34 and the p-type semiconductor region (p+ region) 35 in the side surface. In this configuration, specifically, the photodiode 211 is provided such that more signal charge is accumulated in the pn junction j1 parallel to the plane in the depth direction than in the pn junction j2 parallel to the top surface of the semiconductor substrate 32.

The photodiode 211 is provided as a vertical photodiode. Note that the expression "vertically elongated" photodiode of the first embodiment is not related to the aspect ratio of the photodiode but is related to the aspect ratio of the charge accumulation region.

Figure 25A:
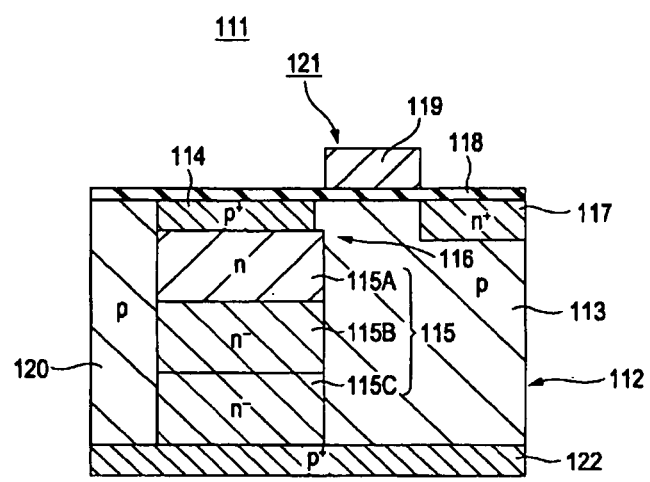
FIGS. 25A and 25B respectively show the schematic configuration of a main part and the potential distribution of a photoelectric conversion portion of an existing solid state imaging device.
Figure 25B:
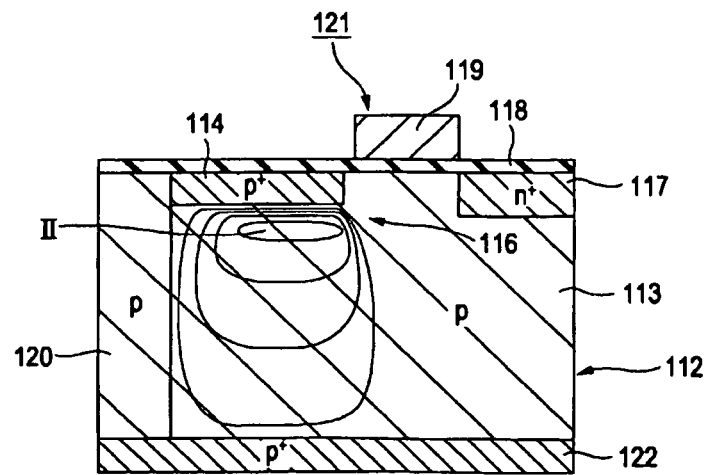

For purposes of comparison with the present invention, FIGS. 25A and 25B show a reference example corresponding to an existing bottom-surface-light-receiving-type CMOS solid state imaging device, in particular, its main part including a photodiode serving as a photoelectric conversion portion. In a solid state imaging device 111 of the reference example, a first-conductivity-type (for example, p-type) semiconductor well region 113 is formed in a semiconductor substrate 112 and a photodiode 116 is formed in the p-type semiconductor well region 113. The photodiode 116 is constituted by a p-type semiconductor region (p+ region) 114 in the top surface and an n-type semiconductor region 115 under the p-type semiconductor region 114. Reference numeral 120 denotes a device isolation region of a p-type semiconductor region. An FD portion 117 of an n-type semiconductor region is formed in the top surface of the p-type semiconductor well region 113. A transfer gate electrode 119 is formed on the substrate 112 with a gate insulation film 118 therebetween and above a region of the substrate 112 between the FD portion 117 and the photodiode 116. Thus, a transfer transistor 121 is formed. A p-type semiconductor region 122 for suppressing dark current is formed in the bottom surface interface of the semiconductor substrate 112.

The photodiode 116 includes, as the n-type semiconductor region 115, an n region 115A that has a high impurity concentration and is formed in the top surface of the n-type semiconductor region 115, and an n− region 115B and an n− region 115C that have a lower impurity concentration in the depth direction. In the photodiode 116, the n region 115A in the top surface substantially serves as a charge accumulation region while the n− region 115B and the n− region 115C having lower impurity concentrations under the n region 115A do not serve as a charge accumulation region. The n region 115A serving as the charge accumulation region of the photodiode 116 has a horizontally oriented shape in terms of aspect ratio. Thus, referring to FIG. 25B showing potential distribution, the shape of a potential II in the photodiode 116 is provided such that signal charge is horizontally accumulated.

In the solid state imaging device 31 according to the first embodiment, since the p-type semiconductor well region 33 has a lower impurity concentration than that of the p-type semiconductor region (p+ region) 35, the most of the capacitance of the n-type semiconductor region 34 is the pn junction capacitance provided between the n-type semiconductor region 34 and the p-type semiconductor region (p+ region) 35. Thus, the most of signal charge (electrons in the first embodiment) provided by photoelectric conversion is accumulated in the side surface of the p-type semiconductor region 35, that is, the n-type semiconductor region 34. As a result, with such a configuration, the photodiode 211 has an increased saturation amount of charge for the footprint. Such an increase in the saturation amount of charge can result in an increase in the dynamic range even when pixels having a reduced size are used.

According to the first embodiment, since a saturation amount of charge can be provided with less footprint, pixels having a further reduced size can be provided. As a result, solid state imaging devices having a smaller size, cameras having a smaller size, solid state imaging devices having a higher resolution, cameras having a higher resolution, and the like can be produced. Since solid state imaging devices can be produced in a smaller size, the production cost can be reduced.

Additionally, the vertical photodiode configuration of the first embodiment permits the capture of signal charge provided by photoelectric conversion before the signal charge reaches the top surface of a substrate. As a result, the occurrence of signal charge reaching neighboring photodiodes is reduced, thereby reducing the occurrence of color mixing.

Figure 4:
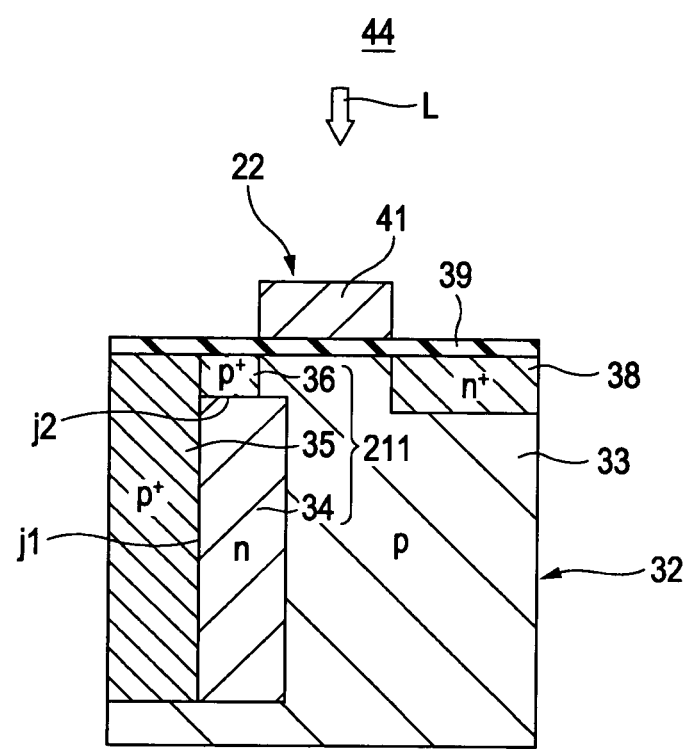
FIG. 4 shows the configuration of a main part according to a second embodiment (the basic configuration of a top-surface-light-receiving-type solid state imaging device) of the present invention.

Second Embodiment: Basic Configuration of Top-Surface-Light-Receiving-Type Solid State Imaging Device FIG. 4 shows a solid state imaging device according to a second embodiment of the present invention, in particular, the basic configuration of a photodiode serving as the photoelectric conversion portion of the solid state imaging device. A solid state imaging device 44 in FIG. 4 is a top-surface-light-receiving-type CMOS solid state imaging device. FIG. 4 is a section view of the main part including a photodiode and a transfer transistor.

As in the first embodiment, in the solid state imaging device 44 according to the second embodiment, a first-conductivity-type (for example, p-type) semiconductor well region 33 is formed in a semiconductor substrate 32 and a photodiode 211 according to the second embodiment of the present invention is formed in the p-type semiconductor well region 33. Specifically, the p-type semiconductor well region 33 includes a second-conductivity-type (for example, n-type) semiconductor region 34 that is vertically elongated in the depth direction of the substrate 32; a p-type semiconductor region 35 that is also vertically elongated and is in contact with a surface of the n-type semiconductor region 34, the surface extending in the depth direction; and a p-type semiconductor region 36 in the top surface of the p-type semiconductor well region 33. The vertically elongated p-type semiconductor region 35 has a higher impurity concentration than that of the p-type semiconductor well region 33. The vertically elongated n-type semiconductor region 34, the vertically elongated p-type semiconductor region 35, and the p-type semiconductor region 36 in the top surface constitute the photodiode 211 of the pixel. The p-type semiconductor region 36 in the top surface suppresses dark current from the interface at the top surface of the substrate 32.

An FD portion 38 constituted by an n-type semiconductor region is formed in the top surface of the p-type semiconductor well region 33. A transfer gate electrode 41 is formed on the substrate 32 with a gate insulation film 39 therebetween and above a region of the substrate 32 between the FD portion 38 and the photodiode 211. Thus, the transfer transistor 22 is formed. Light L is made incident on the top surface of the solid state imaging device 31.

The feature of the solid state imaging device 44 according to the second embodiment different from the first embodiment is that the p-type semiconductor region 42 is not formed in the bottom surface of the semiconductor substrate 32, and an on-chip color filter and an on-chip microlens are formed on the top surface side. Other features are substantially the same as in the first embodiment.

The solid state imaging device 44 according to the second embodiment includes the photodiode 211 having a similar configuration to that in the first embodiment and hence advantages similar to those described in the first embodiment are provided.

Third Embodiment

Figure 5A:
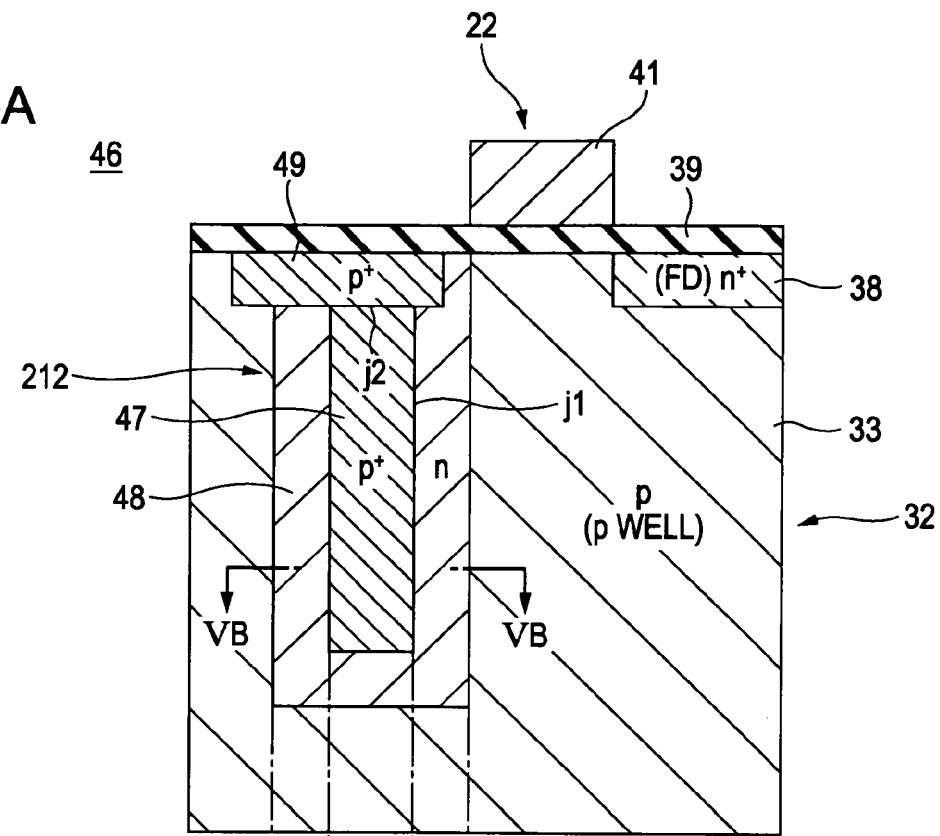
FIG. 5A shows the configuration of a main part according to a third embodiment of the present invention.
Figure 5B:
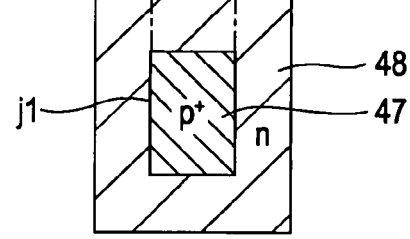
FIG. 5B shows a section taken along line VB-VB in FIG. 5A.

FIGS. 5A and 5B show a solid state imaging device according to a third embodiment of the present invention, in particular, a photodiode serving as the photoelectric conversion portion of the solid state imaging device. FIG. 5A is a section view of the main part including a photodiode and a transfer transistor. In a solid state imaging device 46 according to the third embodiment, a first-conductivity-type (for example, p-type) semiconductor well region 33 is formed in a semiconductor substrate 32 and a photodiode 212 according to the third embodiment of the present invention is formed in the p-type semiconductor well region 33.

Specifically, the p-type semiconductor well region 33 includes a p-type semiconductor region 47 that is vertically elongated from the top surface in the depth direction of the substrate 32 and an n-type semiconductor region 48 that is in contact with the periphery of the p-type semiconductor region 47, the periphery including the bottom surface and the side surfaces of the p-type semiconductor region 47. The vertically elongated p-type semiconductor region 47 has a higher impurity concentration than that in the p-type semiconductor well region 33. A p-type semiconductor region 49 having a high impurity concentration is further formed on the top surface side of the n-type semiconductor region 48. This p-type semiconductor region 49 on the top surface side is formed to cover the whole top surface of the n-type semiconductor region 48 except a portion of the top surface on the transfer gate electrode side of the n-type semiconductor region 48 and to cover the whole top surface of the p-type semiconductor region 47 and a portion of the top surface of the p-type semiconductor well region 33. The p-type semiconductor regions 47 and 49 are formed by implanting ions of a p-type impurity, for example, boron. The n-type semiconductor region 48 is formed by implanting ions of an n-type impurity, for example, phosphorus. The vertically elongated n-type semiconductor region 48, the vertically elongated p-type semiconductor region 47, and the p-type semiconductor region 49 in the top surface constitute the photodiode 212 of the pixel. The p-type semiconductor region 49 in the top surface suppresses dark current from the interface at the top surface of the substrate 32.

The vertically elongated n-type semiconductor region 48 and the vertically elongated p-type semiconductor region 47 are formed by a plurality of ion implantations with different implantation energy so as to have substantially the same impurity concentration over the whole regions in the depth direction. A pn junction j1 described below in which charge is accumulated is constituted by a surface having a length of 1 µm or more in the depth direction of the substrate 32. Red light among visible light reaches farthest into silicon. The most of red light is photoelectrically converted within a depth of 1 µm and hence the pn junction j1 having a depth of 1 µm or more is advantageous for providing sufficiently high sensitivity and reducing the occurrence of color mixing. The pn junction j1 may have a depth of 1 µm or more. However, the pn junction j1 should have a depth of 4 µm or less because visible light does not substantially reach a depth of 4 µm or more and ion implantation to such a depth is conducted with a special apparatus, which considerably increases the production cost.

An FD portion 38 constituted by an n-type semiconductor region is formed in the top surface of the p-type semiconductor well region 33. A transfer gate electrode 41 is formed on the substrate 32 with a gate insulation film 39 therebetween and above a region of the substrate 32 between the FD portion 38 and the photodiode 212. Thus, the transfer transistor 22 is formed. The transfer gate electrode 41 is formed of, for example, a polysilicon film.

In the solid state imaging device 46 according to the third embodiment, the most of the capacitance of the n-type semiconductor region 48 in the photodiode 212 is the pn junction capacitance provided between the n-type semiconductor region 48 and the p-type semiconductor region 47 that extend in the depth direction. Thus, the most of signal charge (electrons in the third embodiment) provided by photoelectric conversion upon receiving light is accumulated in the side surfaces of the vertically elongated p-type semiconductor region 47 extending in the depth direction, that is, the n-type semiconductor region 48. When the transfer transistor 22 enters the on state, signal charge accumulated in the n-type semiconductor region 48 moves around the p-type semiconductor region 47 and are transferred to the FD portion 38.

The solid state imaging device 46 according to the third embodiment includes the photodiode 212 in which the pn junction j1 serving as the major charge accumulation region has a larger area in a plane extending in the depth direction than the area in a plane parallel to the top surface of the semiconductor substrate 32, whereby more signal charge can be held in the surface extending in the depth direction. With such a photodiode configuration, a sufficiently high saturation amount of charge can be provided even when pixels having a reduced size are used.

Note that, in the configuration disclosed in Japanese Unexamined Patent Application Publication No. 2005-191262, the side surfaces of device isolation regions constituted by p-type semiconductor regions and the like also contribute to saturation charge in the photodiodes. However, charge is mainly held in the top surface of the substrate and the configuration is not intended to hold charge in the side surfaces extending in the depth direction.

As in the description of the first embodiment, the photodiode 212 according to the third embodiment has an increased saturation amount of charge for the footprint. Such an increase in the saturation amount of charge can result in an increase in the dynamic range even when pixels having a reduced size are used. Since a saturation amount of charge is increased for a footprint, pixels having a further reduced size can be provided. Additionally, the vertically elongated photodiode configuration permits the capture of signal charge provided by photoelectric conversion before the signal charge reaches the top surface of a substrate. As a result, the occurrence of signal charge reaching the photodiodes of neighboring pixels is reduced, thereby reducing the occurrence of color mixing.

According to the third embodiment, solid state imaging devices having a smaller size, cameras having a smaller size, solid state imaging devices having a higher resolution, cameras having a higher resolution, and the like can also be produced. Since solid state imaging devices can be produced in a smaller size, the production cost can be reduced.

Fourth Embodiment

Figure 6A:
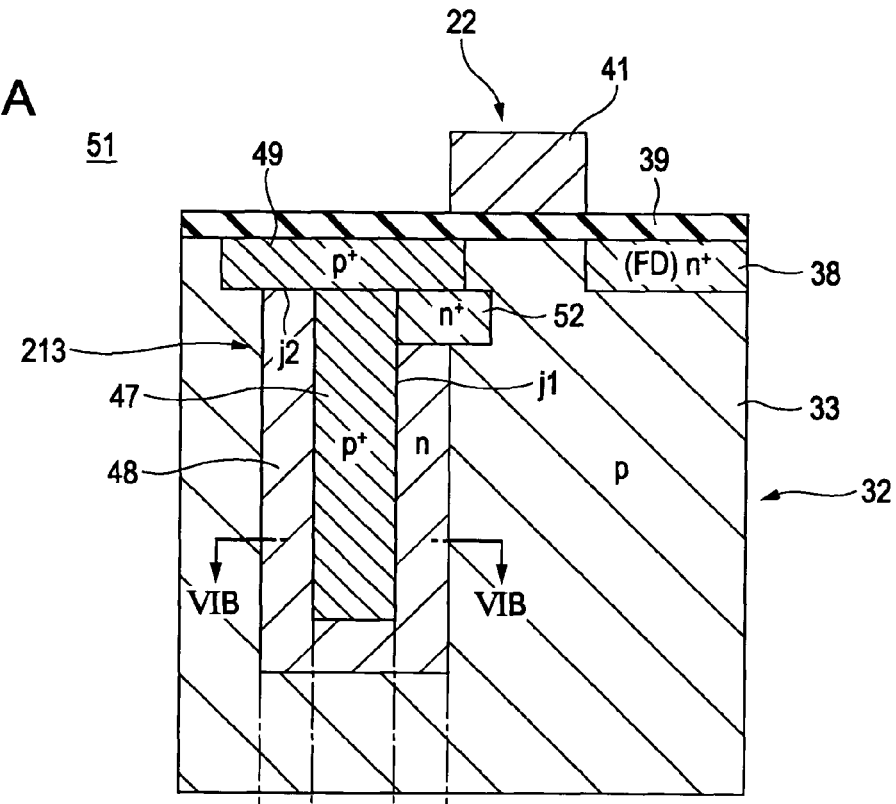
FIG. 6A shows the configuration of a main part according to a fourth embodiment of the present invention.
Figure 6B:
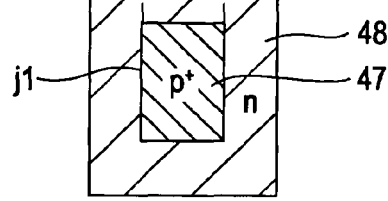
FIG. 6B shows a section taken along line VIB-VIB in FIG. 6A.

FIGS. 6A and 6B show a solid state imaging device according to a fourth embodiment of the present invention, in particular, a photodiode serving as the photoelectric conversion portion of the solid state imaging device. FIG. 6A is a section view of the main part including a photodiode and a transfer transistor. In a solid state imaging device 51 according to the fourth embodiment, an n-type semiconductor region 52 having a slightly higher impurity concentration is further formed in a portion of the n-type semiconductor region 48, the portion being near the transfer gate electrode 41, in the configuration shown in FIG. 5A. Other features of the solid state imaging device 51 are the same as those in the configuration shown in FIG. 5A and hence like features are denoted with like reference numerals and are not described.

The solid state imaging device 51 according to the fourth embodiment includes the n-type semiconductor region 52 having a slightly higher impurity concentration in a portion of the n-type semiconductor region 48 constituting the photodiode 213, the portion being near the transfer gate electrode 41. In this configuration, potential gradient is generated in the n-type semiconductor region 48. As a result, signal charge can be transferred more easily from a deep portion of the n-type semiconductor region 48. The photodiode 213 according to the fourth embodiment has a similar basic configuration to that of the photodiode 212 of the third embodiment and hence advantages similar to those described in the third embodiment are also provided in the fourth embodiment.

Fifth Embodiment

Figure 7A:
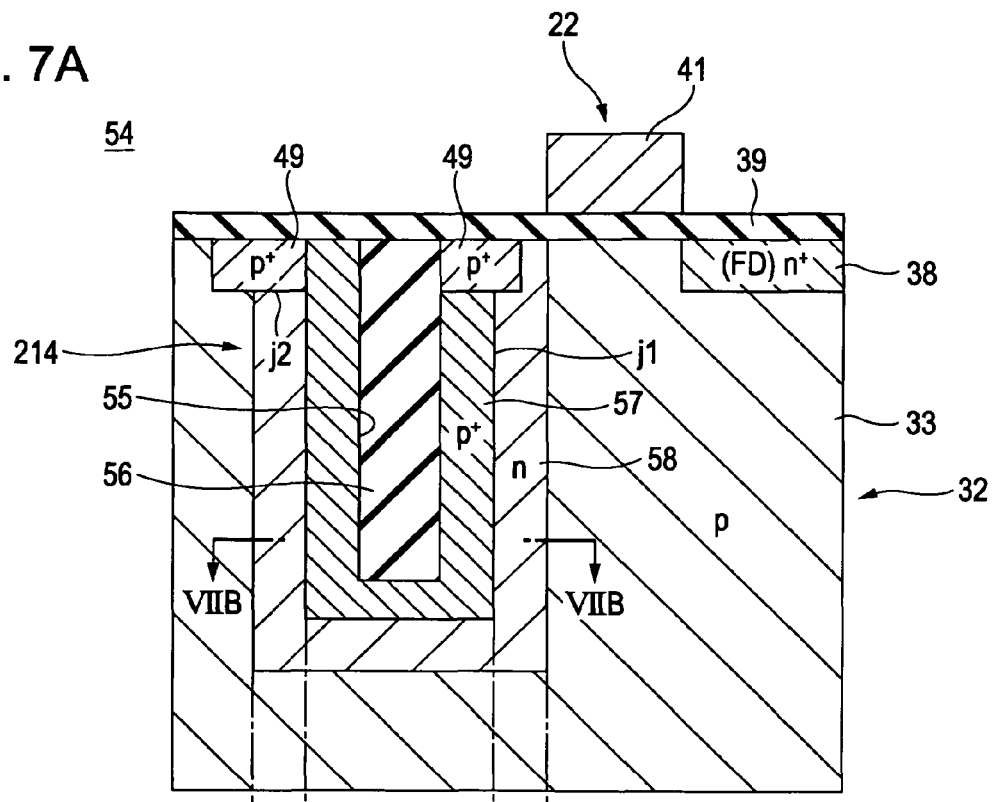
FIG. 7A shows the configuration of a main part according to a fifth embodiment of the present invention.
Figure 7B:
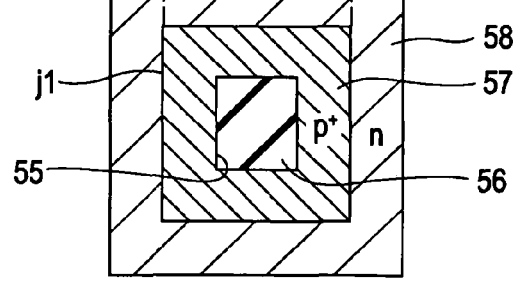
FIG. 7B shows a section taken along line VIIB-VIIB in FIG. 7A.

FIGS. 7A and 7B show a solid state imaging device according to a fifth embodiment of the present invention, in particular, a photodiode serving as the photoelectric conversion portion of the solid state imaging device. FIG. 7A is a section view of the main part including a photodiode and a transfer transistor. In a solid state imaging device 54 according to the fifth embodiment, a trench 55 is formed in a first-conductivity-type (p-type in the fifth embodiment) semiconductor well region 33; the trench 55 is filled with an insulation film 56; and a photodiode 214 according to the fifth embodiment of the present invention is formed around the insulation film 56. The insulation film 56 is formed of, for example, a silicon oxide film.

Specifically, in the fifth embodiment, a p-type semiconductor region 57 extending in the depth direction is formed so as to surround the insulation film 56 filling the trench 55; and an n-type semiconductor region 58 is formed so as to surround the p-type semiconductor region 57. A p-type semiconductor region 49 is further formed in the top surface of the n-type semiconductor region 58. The p-type semiconductor region 57 and the n-type semiconductor region 58 that extend in the depth direction and the p-type semiconductor region 49 in the top surface constitute the photodiode 214. The p-type semiconductor regions 57 and 49 are formed so as to have a higher impurity concentration than that of the p-type semiconductor well region 33. The p-type semiconductor regions 57 and 49 also reduce dark current from the interfaces at the insulation film 56 and the top surface of the substrate 32. Other features of the solid state imaging device 54 are the same as those in the configuration shown in FIG. 5A and hence like features are denoted with like reference numerals and are not described.

The solid state imaging device 54 according to the fifth embodiment includes the vertical photodiode 214 including the p-type semiconductor region 57 and the n-type semiconductor region 58 that extend in the depth direction. With such a configuration, a sufficiently high saturation amount of signals can be provided even when pixels having a reduced size are used. Therefore, such advantages similar to those described in the third embodiment are provided.

The p-type semiconductor region 57 and the n-type semiconductor region 58 in the fifth embodiment can be formed so as to have a uniform impurity concentration in the depth direction by, after the formation of the trench 55, for example, vapor phase diffusion through the trench 55.

Sixth Embodiment

Figure 8:
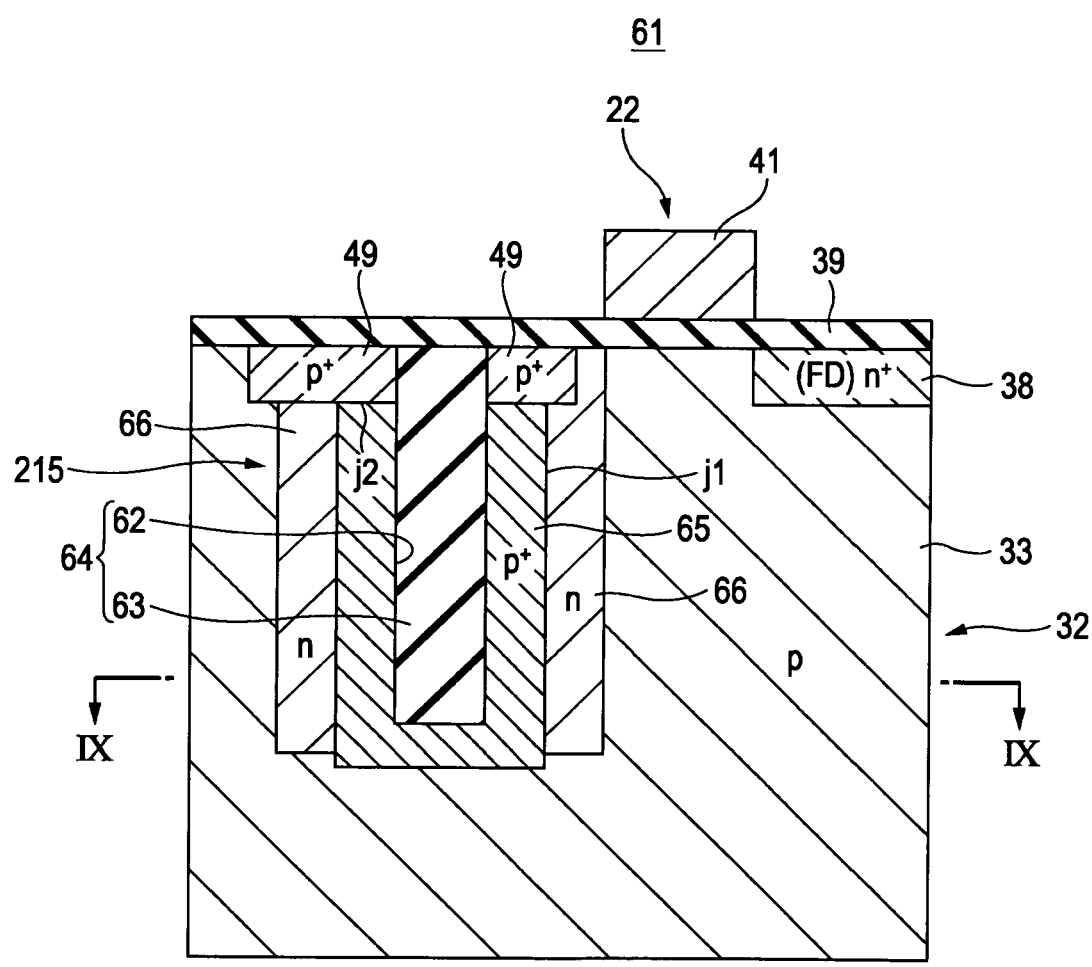
FIG. 8 shows the configuration of a main part according to a sixth embodiment of the present invention (corresponding to a section taken along line VIII-VIII in FIG. 9)
Figure 9:
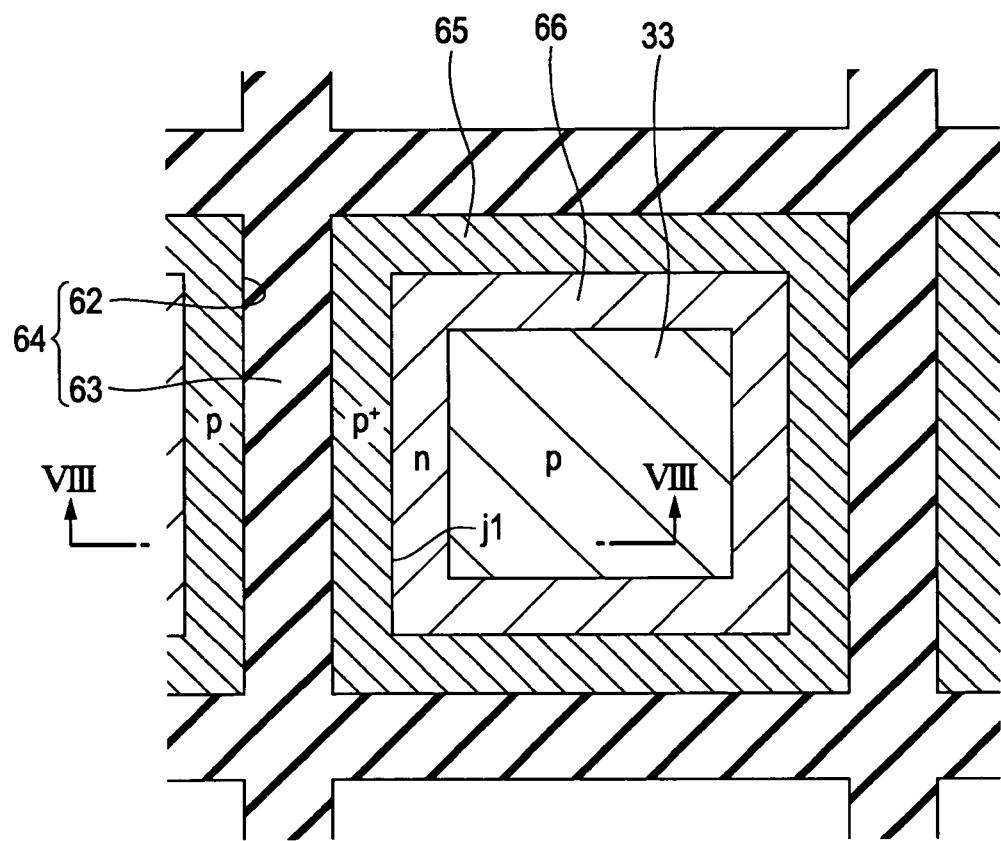
FIG. 9 shows a section taken along line IX-IX in FIG. 8.

FIGS. 8 and 9 show a solid state imaging device according to a sixth embodiment of the present invention, in particular, a photodiode serving as the photoelectric conversion portion of the solid state imaging device. FIG. 8 is a section view of the main part including a photodiode and a transfer transistor. FIG. 9 is a section of a unit pixel, the section being taken along section line IX-IX in FIG. 8. In a solid state imaging device 61 according to the sixth embodiment, a trench device isolation region 64 is formed in a p-type semiconductor well region 33 of a semiconductor substrate 32 so as to delimit each pixel, the trench device isolation region 64 being formed by filling a deep trench 62 with an insulation film 63; and a photodiode 215 is formed to be surrounded by the inner side surfaces of the trench device isolation region 64. The insulation film 63 filling the trench 62 is, for example, a silicon dioxide ($SiO_2$) film.

Referring to FIG. 9, the trench device isolation region 64 is formed as a lattice-shaped region so as to surround pixels in plan view. A p-type semiconductor region 65 is formed so as to be in contact with the inner peripheral surfaces of the trench device isolation region 64 and to extend to the depth of the trench device isolation region 64. n-type semiconductor regions 66 are formed so as to be in contact with the inner peripheral surfaces of the p-type semiconductor region 65. As shown in FIG. 8, the p-type semiconductor region 65 is continuously formed so as to cover the side surfaces and the bottom surface of the insulation film 63 constituting the trench device isolation region 64. The n-type semiconductor regions 66 are separately formed on the both sides of the insulation film 63 constituting the trench device isolation region 64. The n-type semiconductor regions 66 positioned on the left side and the right side of the trench device isolation region 64 in FIG. 8 respectively correspond to the neighboring pixels. As with the case described above, a p-type semiconductor region 49 is formed on the substrate top surface side of the n-type semiconductor regions 66.

The p-type semiconductor regions 65 and 49 are formed so as to have a higher impurity concentration than that of the p-type semiconductor well region 33. The p-type semiconductor regions 65 and 49 and the n-type semiconductor region 66 constitute the photodiode 215. As with the case described in FIG. 7 above, the p-type semiconductor regions 65 and 49 also reduce dark current from the interfaces at the insulation film 63 and the top surface of the substrate 32 (the top surface of the pixel). In the sixth embodiment, pixel transistors (not shown) are formed in the top surface portion of the p-type semiconductor well region 33, the top surface portion being surrounded by the trench device isolation region 64.

Other features including the transfer transistor 22 are the same as those in the configuration described in the third embodiment (FIG. 5) and hence like features are denoted with like reference numerals and are not described.

The solid state imaging device 61 according to the sixth embodiment includes the vertical photodiode 215 including the p-type semiconductor region 65 and the n-type semiconductor region 66 that extend in the depth direction. With such a configuration, a sufficiently high saturation amount of signals can be provided even when pixels having a reduced size are used. Therefore, such advantages similar to those described in the third embodiment are provided. In the sixth embodiment, the photodiode 215 is formed so as to be in contact with the entire inner peripheral of a region delimited by the trench device isolation region 64, whereby the area of a pn junction is increased and hence the saturation amount of charge can be increased. Additionally, the photodiode 215 is surrounded by the trench device isolation region 64 and hence the occurrence of signal charge reaching the photodiodes of neighboring pixels is reduced, the signal charge being produced by photoelectric conversion in a deep portion. As a result, the phenomenon of color mixing can be reduced.

Note that the presence of the trench device isolation region 64 is not indispensable in FIGS. 8 and 9. When the trench device isolation region 64 is not formed, a configuration may also be used in which the p-type semiconductor region (p+ region) 65 also functions as a device isolation region.

Seventh Embodiment

Figure 10A:
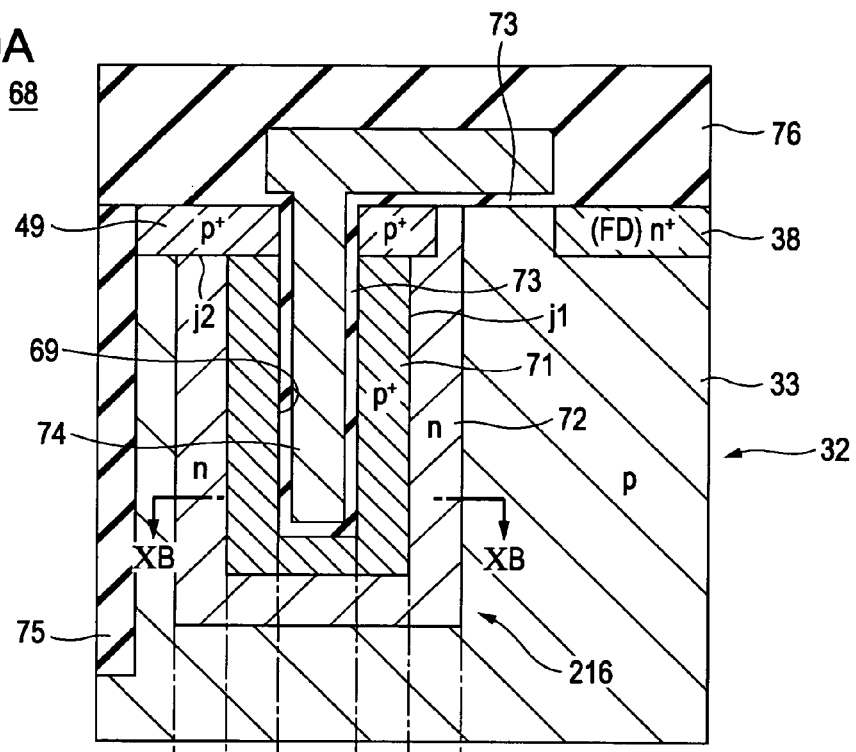
FIG. 10A shows the configuration of a main part according to a seventh embodiment of the present invention.
Figure 10B:
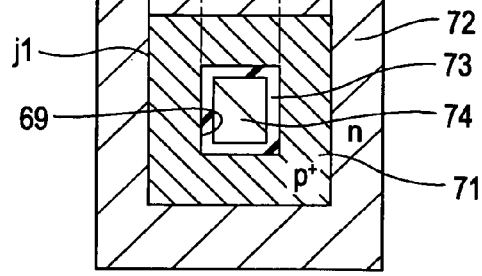
FIG. 10B shows a section taken along line XB-XB in FIG. 10A.

FIGS. 10A and 10B show a solid state imaging device according to a seventh embodiment of the present invention, in particular, a photodiode serving as the photoelectric conversion portion of the solid state imaging device. FIG. 10A is a section view of the main part including a photodiode and a transfer transistor. In a solid state imaging device 68 according to the seventh embodiment, a deep trench 69 is formed in a p-type semiconductor well region 33 of a semiconductor substrate 32; and a p-type semiconductor region 71 and an n-type semiconductor region 72 are sequentially formed in a portion of the p-type semiconductor well region 33, the portion surrounding the trench 69. The p-type semiconductor region 71 is formed on the trench 69 side of the n-type semiconductor region 72. The n-type semiconductor region 72 is formed on a side of the p-type semiconductor region 71, the side being opposite the trench 69. As with the case described in FIG. 8 above, a p-type semiconductor region 49 is formed on the substrate top surface side of the n-type semiconductor region 72.

In the seventh embodiment, a transfer gate electrode 74 is further formed on a gate insulation film 73 in the trench 69. The transfer gate electrode 74 is formed on the gate insulation film 73 so as to extend along the top surface of the substrate and to reach a position above an edge of an FD portion 38 of an n-type semiconductor region formed in the top surface of the p-type semiconductor well region 33. The photodiode 216 is constituted by the p-type semiconductor region 71 extending in the depth direction, the p-type semiconductor region 49 in the top surface, and the n-type semiconductor region 72. Reference numeral 75 denotes a device isolation region constituted by, for example, a p-type diffusion region, an insulation film (for example, a silicon oxide film), or the like.

As in the case described above, the p-type semiconductor region 71 extending in the depth direction and the p-type semiconductor region 49 in the top surface are also formed so as to have a higher impurity concentration than that of the p-type semiconductor well region 33 in the seventh embodiment. An interlayer insulation film 76 composed of, for example, a silicon oxide film is formed on the top surface of the substrate 32.

When a trench is filled with an insulation film and the p-type semiconductor region 71 and the n-type semiconductor region 72 that constitute a photodiode are formed around the trench, many defects are produced at the interface between the trench and the p-type semiconductor region 71. Depending on a production process, there is a possibility that only the presence of the p-type semiconductor region (p+ region) 71 does not reduce dark current or white spots.

In contrast, the solid state imaging device 68 according to the seventh embodiment has a configuration in which the trench 69 is filled with the transfer gate electrode 74 such that the gate insulation film 73 is provided between the trench 69 and the transfer gate electrode 74. With this configuration, application of a negative voltage to the transfer gate electrode 74 upon receiving light and accumulating charge results in collection of holes in the interface and permits reduction of the occurrence of dark current and white spots. The p-type semiconductor region 71 suppresses inhibition of charge transfer to the FD portion 38. This inhibition is caused by an increase in the potential of the n-type semiconductor region 72 of the photodiode, the increase being resulted from capacitive coupling between the transfer gate electrode 74 and the n-type semiconductor region 72 of the photodiode.

The solid state imaging device 68 according to the seventh embodiment includes the vertical photodiode 216 including the p-type semiconductor region 71 and the n-type semiconductor region 72 that extend in the depth direction. With such a configuration, a sufficiently high saturation amount of signals can be provided even when pixels having a reduced size are used. Therefore, such advantages similar to those described in the third embodiment are also provided.

Eighth Embodiment

Figure 11A:
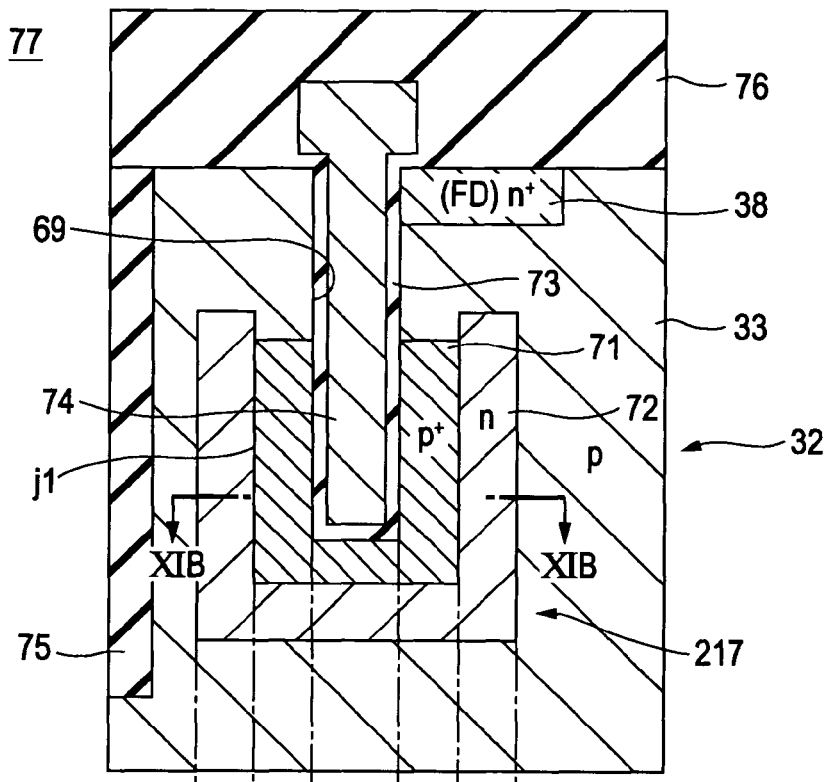
FIG. 11A shows the configuration of a main part according to an eighth embodiment of the present invention.
Figure 11B:
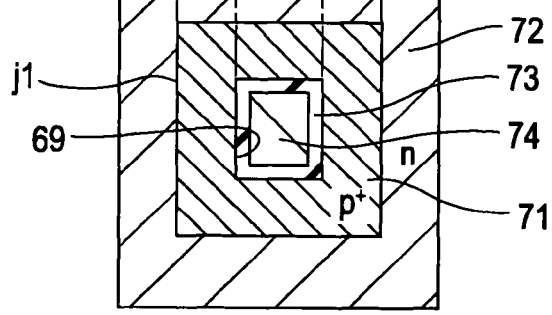
FIG. 11B shows a section taken along line XIB-XIB in FIG. 11A.

FIGS. 11A and 11B show a solid state imaging device according to an eighth embodiment of the present invention, in particular, a photodiode serving as the photoelectric conversion portion of the solid state imaging device. FIG. 11A is a section view of the main part including a photodiode and a transfer transistor. In a solid state imaging device 77 according to the eighth embodiment, a deep trench 69 is formed in a p-type semiconductor well region 33 of a semiconductor substrate 32; and a photodiode 217 is formed in surfaces of the p-type semiconductor well region 33 except a region near the top surface of the substrate 32, the surfaces surrounding the trench 69. The photodiode 217 is constituted by the p-type semiconductor region 71 being in contact with the trench 69 and the n-type semiconductor region 72 being in contact with the surfaces of the p-type semiconductor region 71, the surfaces respectively being opposite the surfaces of the p-type semiconductor region 71 being in contact with the trench 69. The n-type semiconductor region 72 is formed such that the top end of the n-type semiconductor region 72 is higher than the level of the top end of the p-type semiconductor region 71.

In this configuration, the p-type semiconductor region 71 and the n-type semiconductor region 72 constituting the photodiode 217 are also formed so as to have a vertical shape extending in the depth direction. The p-type semiconductor region 71 is formed so as to have a higher impurity concentration that that of the p-type semiconductor well region 33. An interlayer insulation film 76 composed of, for example, a silicon oxide film is formed on the top surface of the substrate 32.

An FD portion 38 constituted by an n-type semiconductor region is formed so as to be in contact with the trench 69 in the top surface of the substrate 32. Specifically, the FD portion 38 is formed immediately above the photodiode 217. A transfer gate electrode 74 is formed so as to fill the trench 69 with a gate insulation film 73 therebetween. In this configuration, the transfer transistor 22 transfers charge in the depth direction (that is, the vertical direction) of the substrate 32. Reference numeral 75 denotes a device isolation region constituted by, for example, a p-type diffusion region, an insulation film (for example, a silicon oxide film), or the like.

The solid state imaging device 77 according to the eighth embodiment includes the vertical photodiode 217 including the p-type semiconductor region 71 and the n-type semiconductor region 72 that extend in the depth direction. With such a configuration, a sufficiently high saturation amount of signals can be provided even when pixels having a reduced size are used. Therefore, such advantages similar to those described in the third embodiment are also provided.

In this configuration, the photodiode 217 and the FD portion 38 are aligned vertically and hence further reduction of the size of the solid state imaging device can be achieved.

Ninth Embodiment

Figure 12:
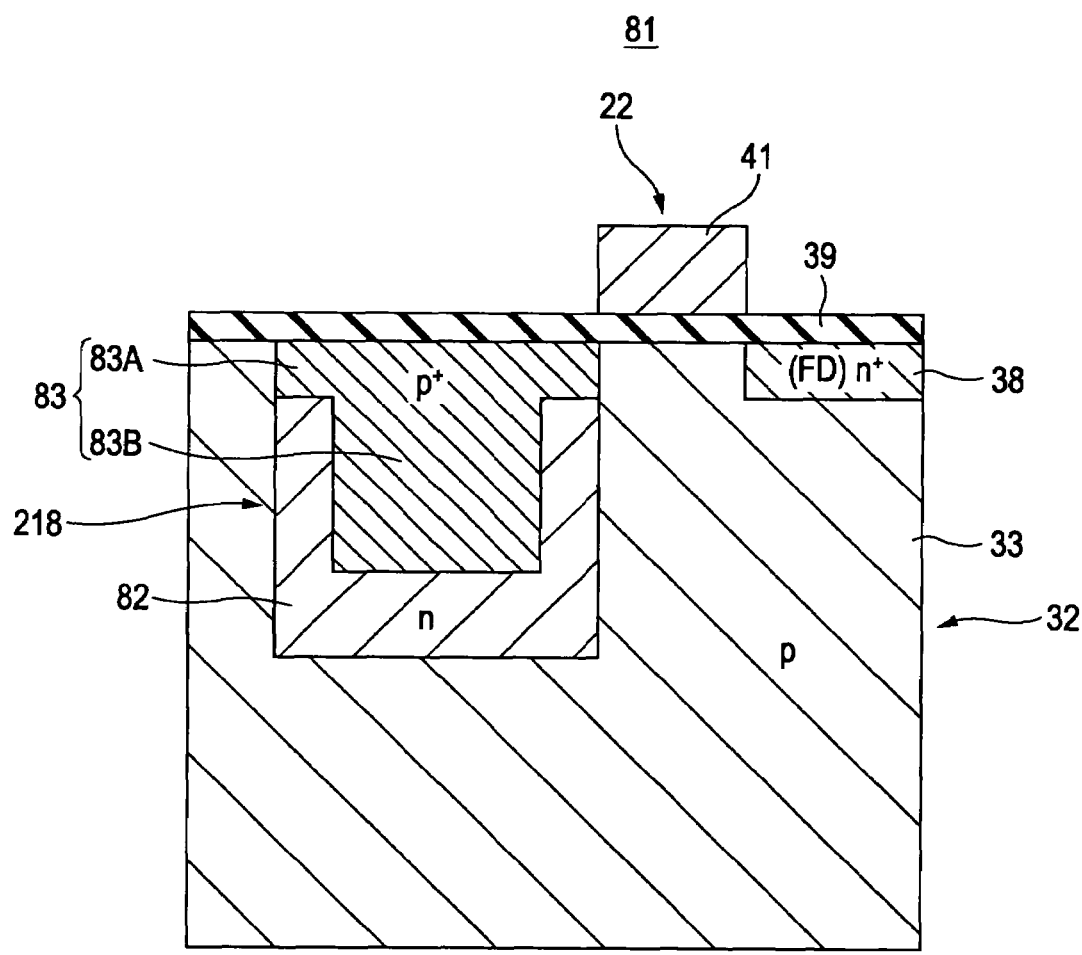
FIG. 12 shows the configuration of a main part according to a ninth embodiment according to the present invention.

FIG. 12 shows a solid state imaging device according to a ninth embodiment of the present invention, in particular, a photodiode serving as the photoelectric conversion portion of the solid state imaging device. FIG. 12 is a section view of the main part including a photodiode and a transfer transistor. In a solid state imaging device 81 according to the ninth embodiment, a photodiode 218 according to the ninth embodiment is formed in a p-type semiconductor well region 33 of a semiconductor substrate 32. The photodiode 218 is constituted by an n-type semiconductor region 82 and a p-type semiconductor region 83.

In the ninth embodiment, in particular, the p-type semiconductor region 83 is constituted by a p+ region 83A that is formed over the entire top surface of the n-type semiconductor region 82 and also functions to suppress dark current; and a p+ region 83B that extends from the p+ region 83A in the depth direction with a cross-sectional area smaller than the surface area of the p+ region 83A. The p-type semiconductor region 83 is formed so as to have a similar impurity concentration in the depth direction. The n-type semiconductor region 82 is also formed so as to have a similar impurity concentration in the depth direction.

The photodiode 218 of the ninth embodiment has a large pn junction area and includes the p+ region 83B extending in the depth direction of the p-type semiconductor region 83. In this configuration, a potential is formed in which charge is mainly accumulated in the vertical direction (depth direction).

An FD portion 38 constituted by an n-type semiconductor region is formed in the top surface of the p-type semiconductor well region 33. A transfer gate electrode 41 is formed on the substrate 32 with a gate insulation film 39 therebetween and above a region of the substrate 32 between the FD portion 38 and the photodiode 218. Thus, the transfer transistor 22 is formed.

The solid state imaging device 81 according to the ninth embodiment includes the photodiode 218 including the n-type semiconductor region 82 and the p-type semiconductor region 83 in which its cross-sectional area is once reduced in the depth direction. In this configuration, the pn junction capacitance is large and charge is mainly accumulated in the vertical direction. As a result, more signal charge can be accumulated and a sufficiently high saturation amount of charge can be provided even when pixels having a reduced size are used. Thus, such advantages similar to those described in the third embodiment are provided.

Method for Producing Solid State Imaging Device

Hereinafter, methods for producing solid state imaging device according to embodiments of the present invention are described. In the following embodiments, only methods for producing photodiodes are described.

First Embodiment of Production Method

FIGS. 13A to 15F show a method for producing a solid state imaging device according to a first embodiment of the present invention, in particular, a method for producing a photodiode constituting a pixel of the solid state imaging device. The photodiode produced in this first embodiment corresponds to the photodiodes shown in FIGS. 5A and 6A.

Figure 13A:
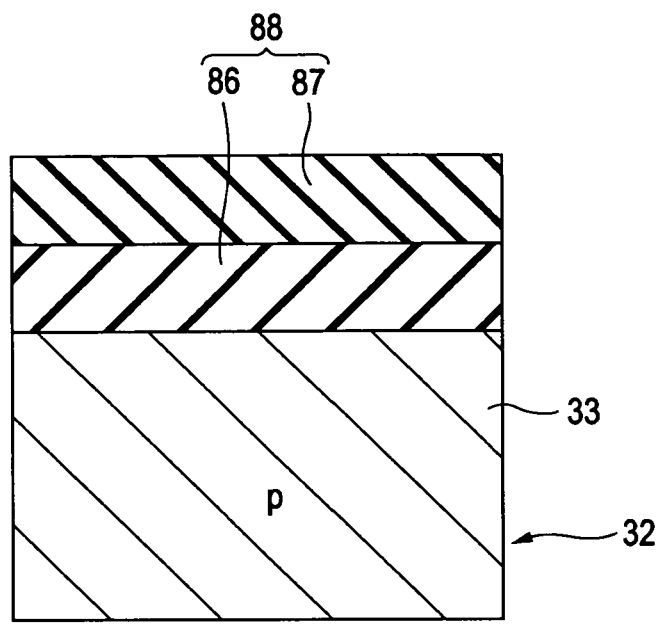
FIGS. 13A and 13B show production steps (part 1) of a method for producing a solid state imaging device according to a first embodiment of the present invention, in particular, a method for producing a photoelectric conversion portion of the solid state imaging device.

Referring first to FIG. 13A, an insulation film 88 having a bilayer structure of a silicon dioxide ($SiO_2$) film 86 with a certain thickness and a silicon nitride (SiN) film 87 with a certain thickness is formed on the top surface of a p-type semiconductor well region 33 of a semiconductor substrate 32. The silicon nitride film 87 is optimal as an etching mask because a high selectivity ratio between silicon nitride and silicon (Si) can be provided in etching silicon (Si). The silicon oxide film 86, which serves as the underlayer, suppresses roughness in the surface of the silicon, the roughness being caused by the silicon nitride film 87. Thus, the silicon oxide film 86 protects the surface of the silicon.

Figure 13B:
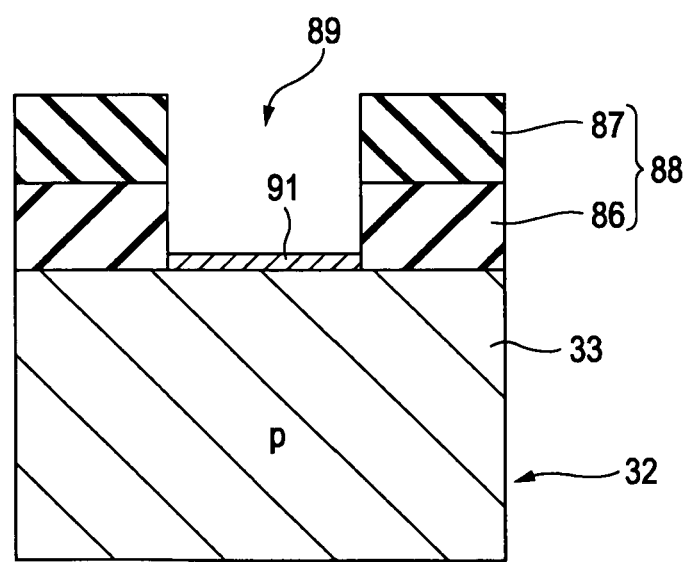

Referring then to FIG. 13B, an opening 89 extending to the surface of the silicon is formed by selectively etching a portion of the insulation film 88, the portion corresponding to a region in which a photodiode is to be formed. A silicon oxide film 91 is subsequently formed on the surface of the exposed silicon in the opening 89 by a mild oxidation treatment.

Figure 14C:
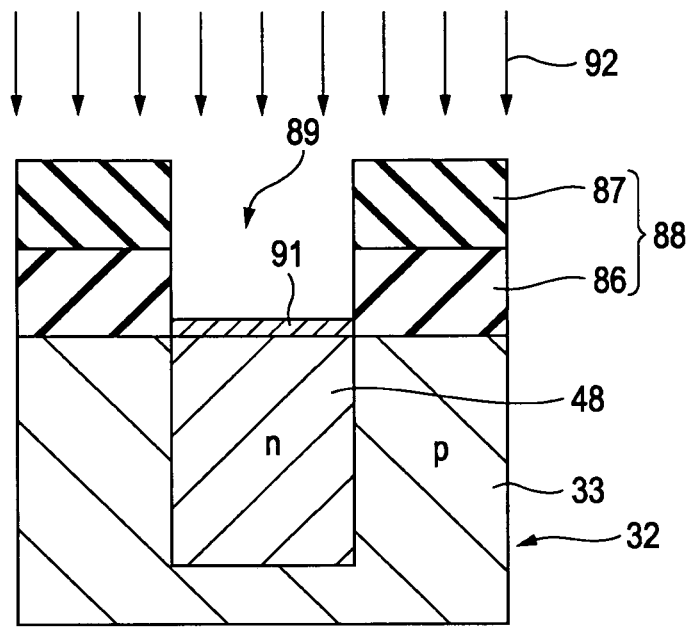
FIGS. 14C and 14D show production steps (part 2) of a method for producing a solid state imaging device according to the first embodiment of the present invention, in particular, a method for producing a photoelectric conversion portion of the solid state imaging device.

Referring then to FIG. 14C, an n-type semiconductor region 48 vertically elongated in the depth direction is formed by implanting ions of an n-type impurity 92, for example, phosphorus (P), into a depth of about 2 μm from the surface of the silicon with the insulation film 88 serving as a mask. This ion implantation of phosphorus (P) is conducted two or more times, for example, about 10 times in which the ions are implanted vertically to a slightly different depth every time, that is, with a different implantation energy, into a depth of about 2 μm from the surface of the silicon. The ions of the impurity are implanted at almost the same dose for each time.

Figure 14D:
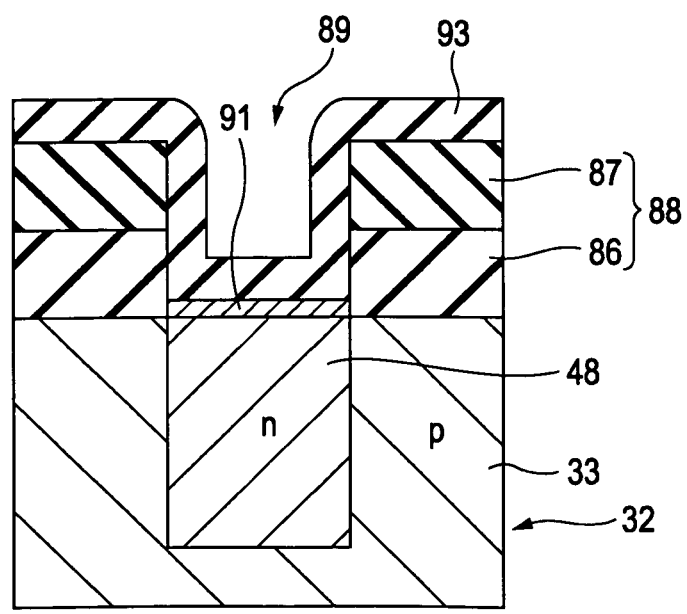

Referring then to FIG. 14D, an insulation film 93, for example, a silicon dioxide ($SiO_2$) film is formed so as to cover the surface of the insulation film 88 including the inner surfaces of the opening 89.

Figure 15E:
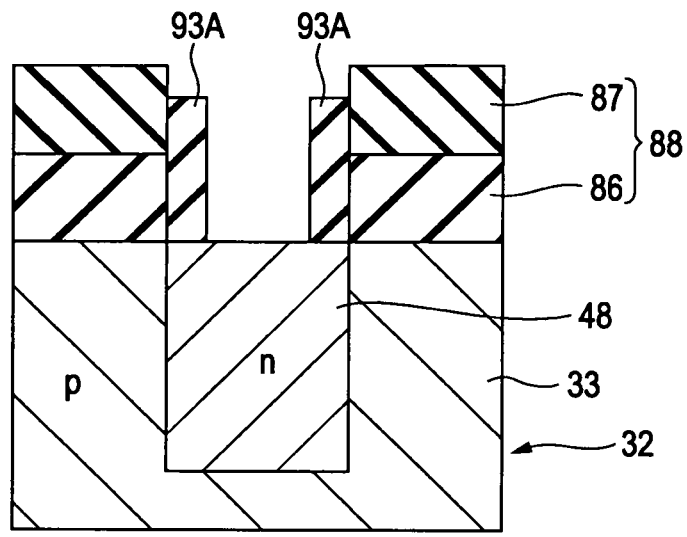
FIGS. 15E and 15F show production steps (part 3) of a method for producing a solid state imaging device according to the first embodiment of the present invention, in particular, a method for producing a photoelectric conversion portion of the solid state imaging device.

Referring then to FIG. 15E, the insulation film 93 (for example, a silicon dioxide film) is etched back by reactive ion etching. As a result, side walls 93A composed of the insulation film 93 (for example, a silicon dioxide film) is formed on the inner walls of the opening 89.

Figure 15F:
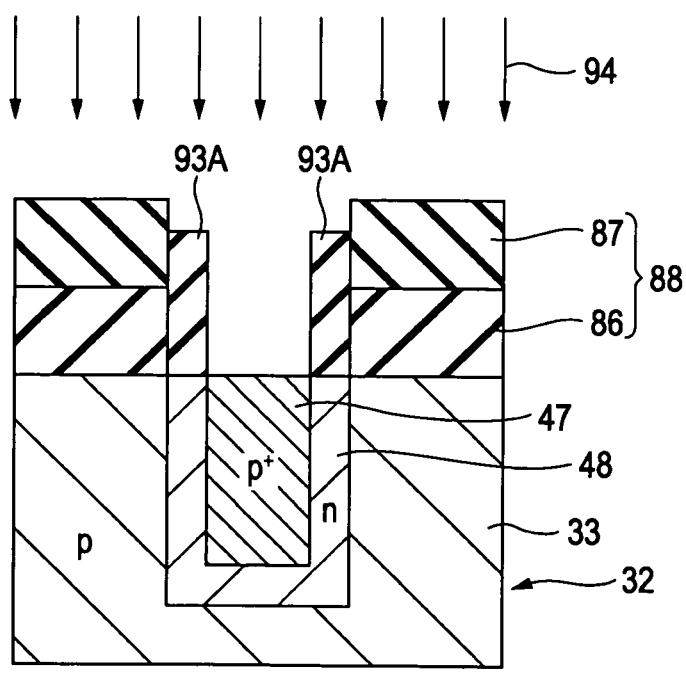

Referring then to FIG. 15F, a p-type semiconductor region 47 elongated in the depth direction is formed in the n-type semiconductor region 48 by implanting ions of a p-type impurity 94, for example, boron (B), into a depth of about 1.8 μm from the surface of the silicon with the insulation film 88 and the side walls 93A serving as masks. As in the case described above, this ion implantation of boron (B) is conducted two or more times, for example, about 10 times in which the ions are implanted vertically to a slightly different depth every time, that is, with a different implantation energy, into a depth of about 1.8 μm from the surface of the silicon. The ions of the impurity are implanted at almost the same dose for each time. Thus, a photodiode is formed that serves as a main part and includes a pn junction between the n-type semiconductor region 48 and the p-type semiconductor region 47, which elongate in the depth direction.

After this step, the silicon nitride film 87, the silicon oxide film 86, and the side walls 93A are stripped and general production steps are conducted.

Figure 16A:
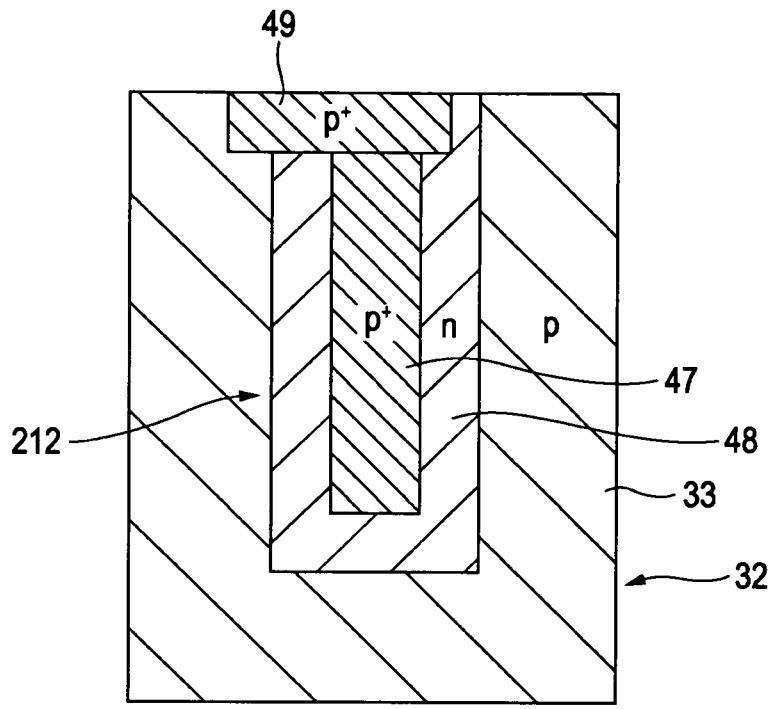
FIGS. 16A and 16B show production steps (part 4) of a method for producing a solid state imaging device according to the first embodiment of the present invention, in particular, a method for producing a photoelectric conversion portion of the solid state imaging device.

For example, referring to FIG. 16A, a p-type semiconductor region 49 is formed in the top surfaces of the n-type semiconductor region 48 and the p-type semiconductor region 47. As a result, the photodiode 212 according to the third embodiment shown in FIG. 5 is formed, the photodiode 212 being constituted by the n-type semiconductor region 48 and the p-type semiconductor region 47 that elongate in the depth direction and the p-type semiconductor region 49 in the top surfaces of these regions.

Figure 16B:
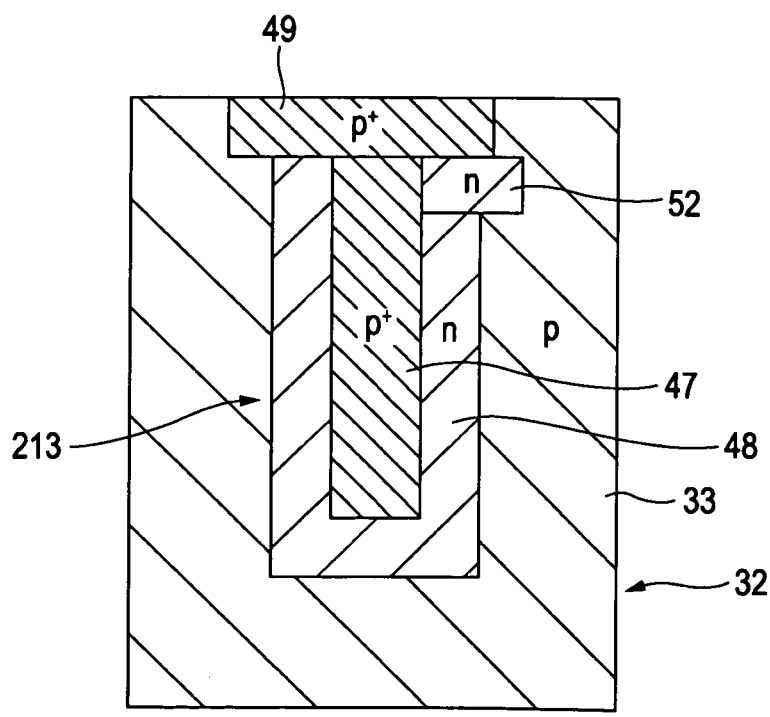

Alternatively, for example, referring to FIG. 16B, an n-type semiconductor region 52 having a high impurity concentration is formed in the vicinity of the transfer gate electrode (not shown) of the n-type semiconductor region 48; and the p-type semiconductor region 49 is formed in the top surfaces of the n-type semiconductor regions 48 and 52 and the p-type semiconductor region 47. As a result, the photodiode 213 according to the fourth embodiment shown in FIG. 6 is formed, the photodiode 213 being constituted by the n-type semiconductor region 48 and the p-type semiconductor region 47 that elongate in the depth direction and the p-type semiconductor region 49 and the n-type semiconductor region 52 in the surfaces of these regions.

Second Embodiment of Production Method

FIGS. 17A to 18D show a method for producing a solid state imaging device according to a second embodiment of the present invention, in particular, a method for producing a photodiode constituting a pixel of the solid state imaging device. A production method of this second embodiment includes a step of forming an n-type semiconductor region and a p-type semiconductor region that elongate in the depth direction and subsequently forming a trench in the p-type semiconductor region.

Figure 17A:
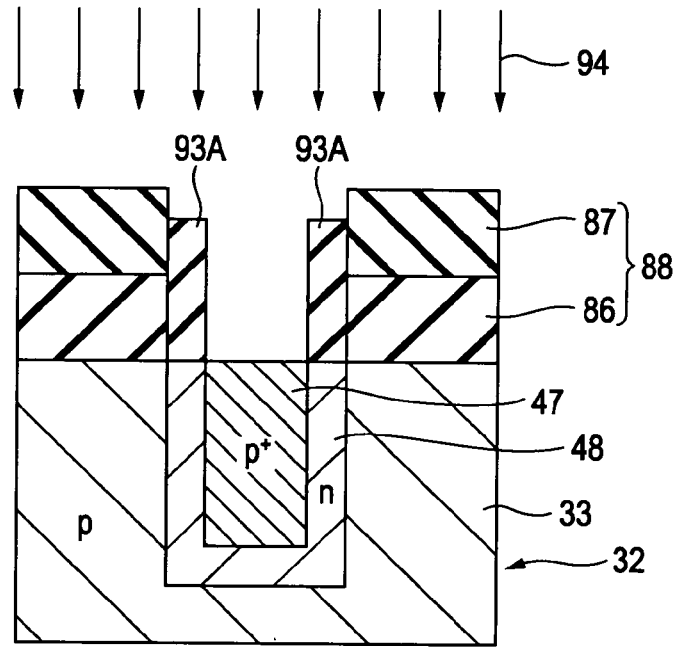
FIGS. 17A and 17B show production steps (part 1) of a method for producing a solid state imaging device according to a second embodiment of the present invention, in particular, a method for producing a photoelectric conversion portion of the solid state imaging device.

Referring to FIG. 17A, the p-type semiconductor region 47 is formed in the n-type semiconductor region 48 by implanting ions of a p-type impurity 94 with the side walls 93A and the insulation film 88 serving as masks. The steps in the production method up to and including this step in FIG. 17A are the same as those shown in FIGS. 13A to 15F.

Figure 17B:
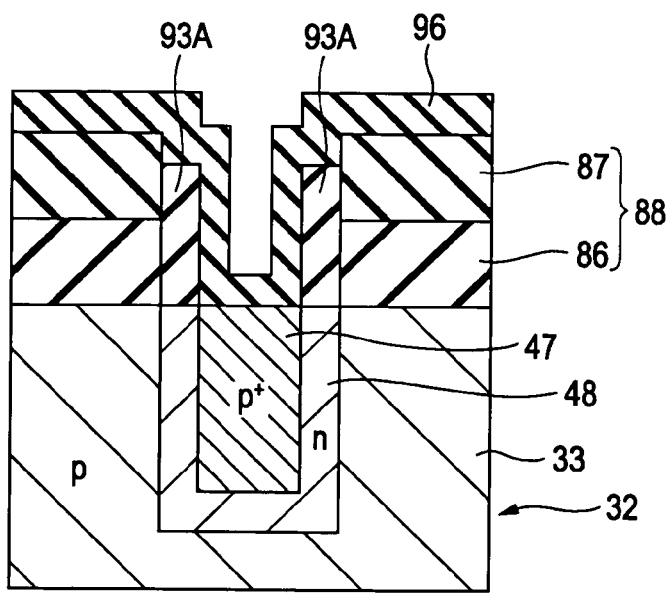

Referring then to FIG. 17B, an insulation film 96, for example, a silicon dioxide film ($SiO_2$) is further formed on the top surface of the resultant structure.

Figure 18C:
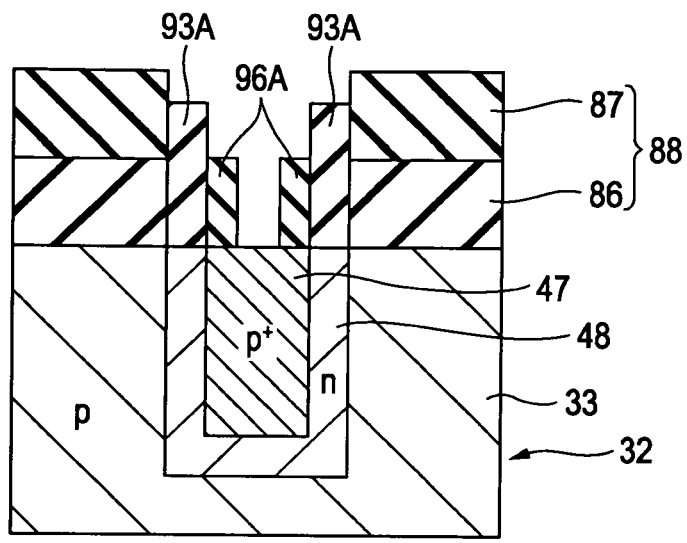
FIGS. 18C and 18D show production steps (part 2) of a method for producing a solid state imaging device according to the second embodiment of the present invention, in particular, a method for producing a photoelectric conversion portion of the solid state imaging device.

Referring then to FIG. 18C, the insulation film 96 (for example, a silicon dioxide film) is etched back by reactive ion etching. As a result, side walls 96A constituted by the insulation film 96 are formed on the inner surfaces of the side walls 93A.

Figure 18D:
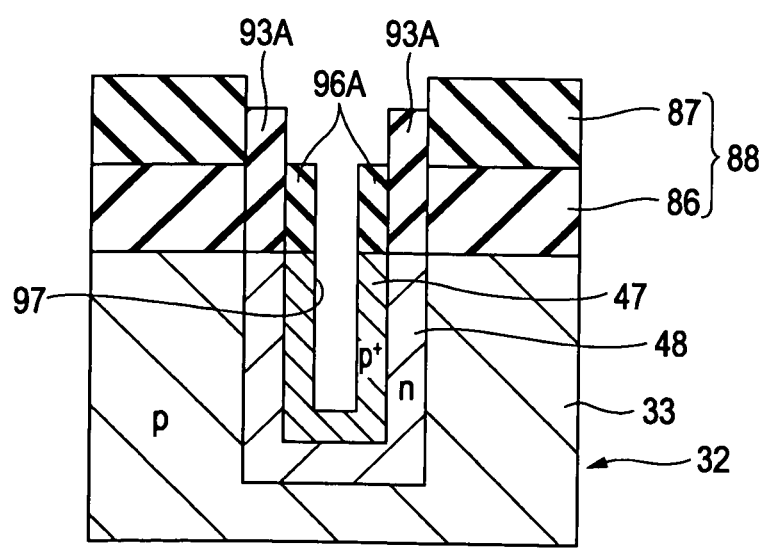

Referring then to FIG. 18D, a trench 97 is formed in the p-type semiconductor region 47 by selective etching with the side walls 96A serving as masks.

After that, the photodiode 214 according to the fifth embodiment shown in FIGS. 7A and 7B can be formed by, for example, forming a p-type semiconductor region in the top surfaces of the n-type semiconductor region 48 and the p-type semiconductor region 47 and filling the trench 97 with an insulation film such as a silicon oxide film.

Alternatively, the photodiode 216 according to the seventh embodiment shown in FIGS. 10A and 10B can also be formed by, after the formation of the trench 97, forming a p-type semiconductor region in the top surfaces of the n-type semiconductor region 48 and the p-type semiconductor region 47 and forming a transfer gate electrode in the trench 97 with a gate insulation film therebetween. The photodiode 217 according to the eighth embodiment shown in FIGS. 11A and 11B can also be obviously formed by forming, in the earlier steps, the n-type semiconductor region 48 and the p-type semiconductor region 47 only in a deep portion apart from the top surface of the p-type semiconductor well region 33.

Third Embodiment of Production Method

FIGS. 19A to 21F show a method for producing a solid state imaging device according to a third embodiment of the present invention, in particular, a method for producing a photodiode constituting a pixel of the solid state imaging device.

Figure 19A:
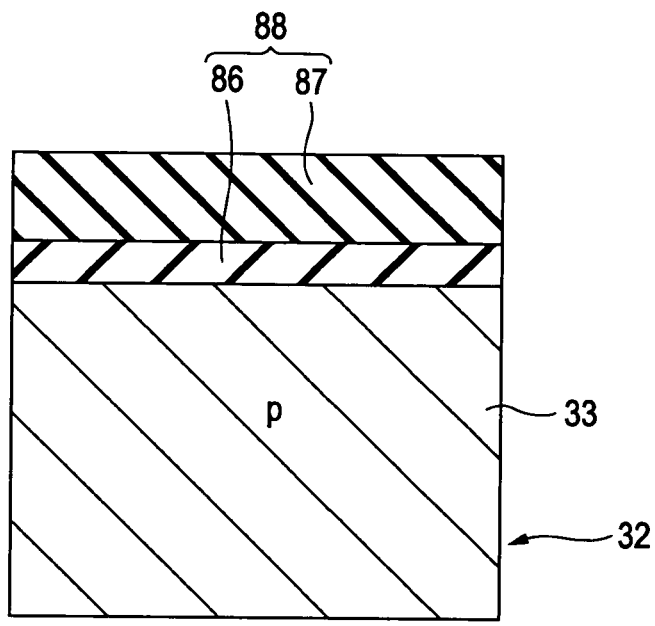
FIGS. 19A and 19B show production steps (part 1) of a method for producing a solid state imaging device according to a third embodiment of the present invention, in particular, a method for producing a photoelectric conversion portion of the solid state imaging device.

Referring first to FIG. 19A, an insulation film 88 having a bilayer structure of a silicon dioxide ($SiO_2$) film 86 with a small thickness and a silicon nitride (SiN) film 87 with a large thickness is formed on the top surface of a p-type semiconductor well region 33 of a semiconductor substrate 32.

Figure 19B:
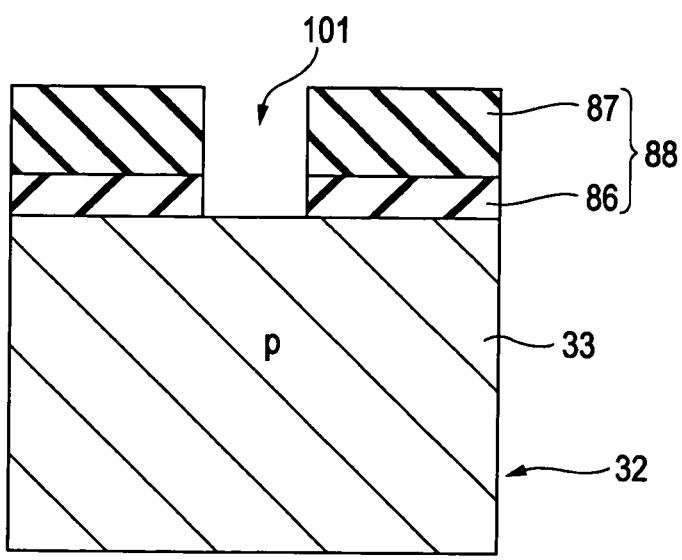

Referring then to FIG. 19B, an opening 101 is formed by selectively etching a portion of the insulation film 88, the portion corresponding to a region in which a photodiode is to be formed.

Figure 20C:
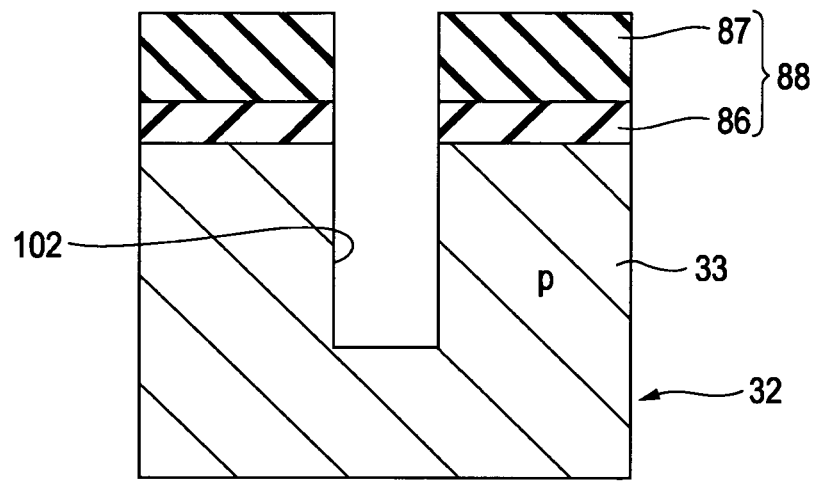
FIGS. 20C and 20D show production steps (part 2) of a method for producing a solid state imaging device according to the third embodiment of the present invention, in particular, a method for producing a photoelectric conversion portion of the solid state imaging device.

Referring then to FIG. 20C, a trench 102 having a certain depth is formed by selectively etching the p-type semiconductor well region 33 with the insulation film 88 serving as a mask.

Figure 20D:
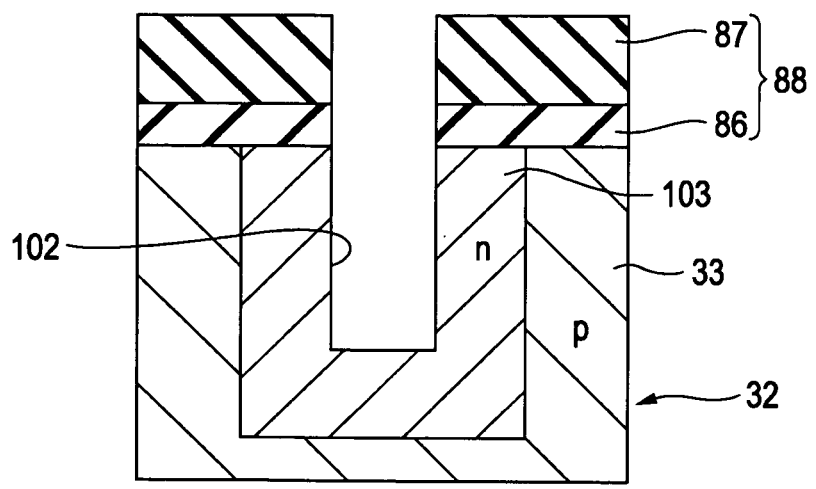

Referring then to FIG. 20D, an n-type impurity, for example, phosphorus (P), is diffused by vapor phase diffusion or liquid phase diffusion through the trench 102 to its surrounding region. As a result, an n-type semiconductor region 103 surrounding the trench 102 is formed in the p-type semiconductor well region 33.

Figure 21E:
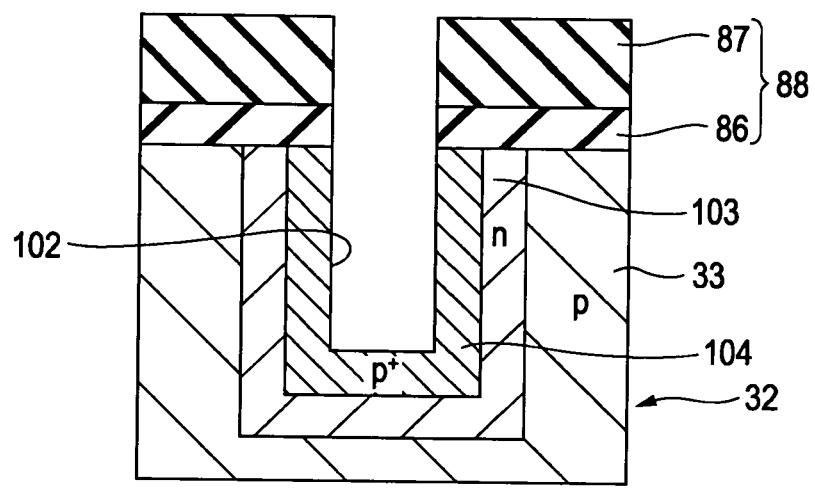
FIGS. 21E and 21F show production steps (part 3) of a method for producing a solid state imaging device according to the third embodiment of the present invention, in particular, a method for producing a photoelectric conversion portion of the solid state imaging device.

Referring then to FIG. 21E, a p-type impurity, for example, boron (B), is diffused by vapor phase diffusion or liquid phase diffusion through the trench 102 to its surrounding region. As a result, a p-type semiconductor region 104 surrounding the trench 102 is formed in the n-type semiconductor region 103. In this diffusion of boron (B), the amount of boron (B) to be diffused is made smaller than the amount of phosphorus (P) diffused. Phosphorus (P) is thought to diffuse also in the boron diffusion. For this reason, the n-type semiconductor region 103 is formed so as to be at a proper distance from the p-type semiconductor region (p+ region) 104. To provide such a configuration, diffusion temperature and diffusion time are adjusted in the phosphorus (P) diffusion and in the boron (B) diffusion.

For example, the phosphorus diffusion can be conducted by, in the case of vapor phase diffusion, simultaneously feeding phosphoryl chloride ($POCl_3$) containing phosphorus and oxygen into a furnace at about 900° C.

For example, the boron diffusion can be conducted with a $B_2H_6$ gas for vapor phase diffusion or with $BBr_3$ serving as a liquid source for liquid phase diffusion.

Figure 21F:
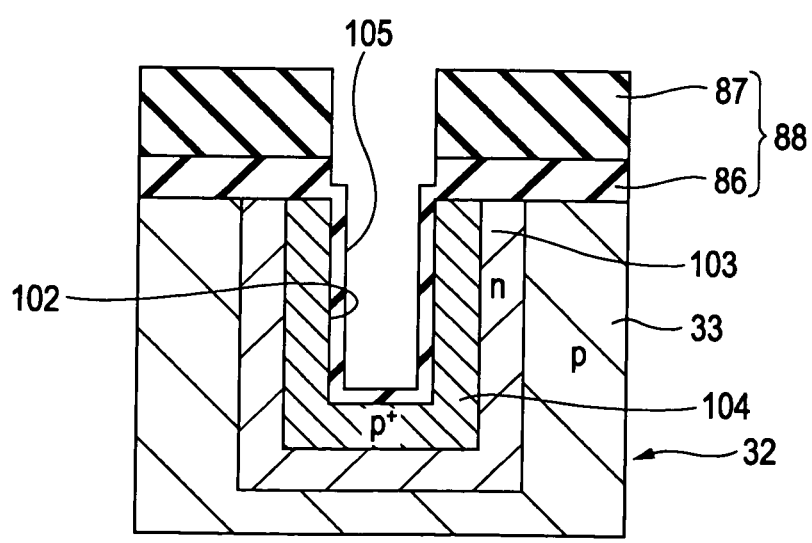

Referring then to FIG. 21F, an oxide film 105 having a small thickness is formed by mildly oxidizing the inner surfaces of the trench 102 such that the oxide film 105 covers rough portions in the interface between the trench 102 and the silicon dioxide film 86. After that, it is preferred that the thin oxide film 105 be stripped with diluted hydrofluoric acid or the like and the inner surfaces of the trench 102 be again mildly oxidized to form a thin oxide film.

After that, the trench 102 is filled with a silicon dioxide ($SiO_2$) film or a transfer gate electrode is formed in the trench 102 with the thin oxide film serving as a gate insulation film. As a result, the photodiode 214 shown in FIGS. 7A and 7B, the photodiode 216 shown in FIGS. 10A and 10B, or the like can be formed. Note that the photodiode 217 shown in FIGS. 11A and 11B can be formed by masking the inner surfaces of the trench 102 from its top surface to a certain depth in the phosphorus diffusion and in the boron diffusion.

Alternatively, after the step shown in FIG. 21E, a deep trench extending through the p-type semiconductor region 104 and the n-type semiconductor region 103 can also be formed by subjecting silicon at the bottom of the trench 102 to reactive ion etching.

Fourth Embodiment of Production Method

FIGS. 22A to 23D show a method for producing a solid state imaging device according to a fourth embodiment of the present invention, in particular, a method for producing a photodiode constituting a pixel of the solid state imaging device. This fourth embodiment is applicable to the production of the above-described photodiode shown in FIGS. 8 and 9.

Figure 22A:
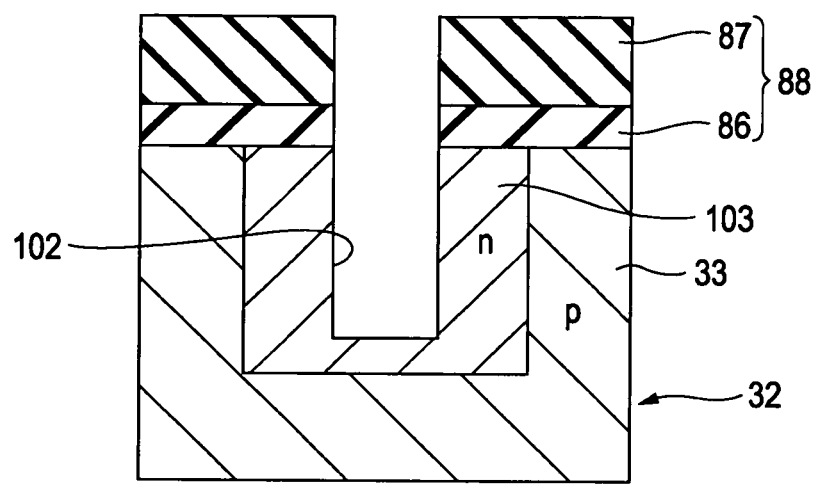
FIGS. 22A and 22B show production steps (part 1) of a method for producing a solid state imaging device according to a fourth embodiment of the present invention, in particular, a method for producing a photoelectric conversion portion of the solid state imaging device.

The method of the fourth embodiment includes the same steps as those shown in FIGS. 19A to 20D. FIG. 22A is the same as FIG. 20D and hence like features are denoted with like reference numerals and are not described. Referring to FIG. 9, the trench 102 is formed so as to surround respective pixel regions in plan view.

Figure 22B:
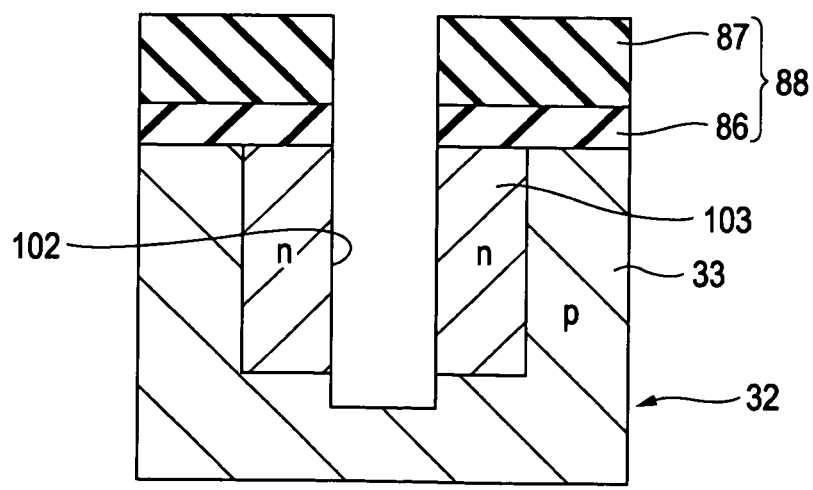

Referring then to FIG. 22B, a deep trench 102 extending through the bottom of the n-type semiconductor region 103 is formed by selectively etching the bottom of the trench 102.

Figure 23C:
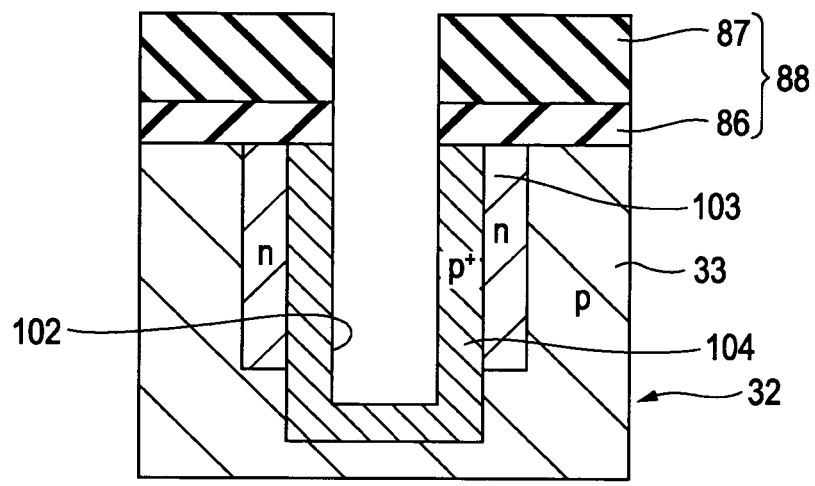
FIGS. 23C and 23D show production steps (part 2) of a method for producing a solid state imaging device according to the fourth embodiment of the present invention, in particular, a method for producing a photoelectric conversion portion of the solid state imaging device.
Figure 23D:
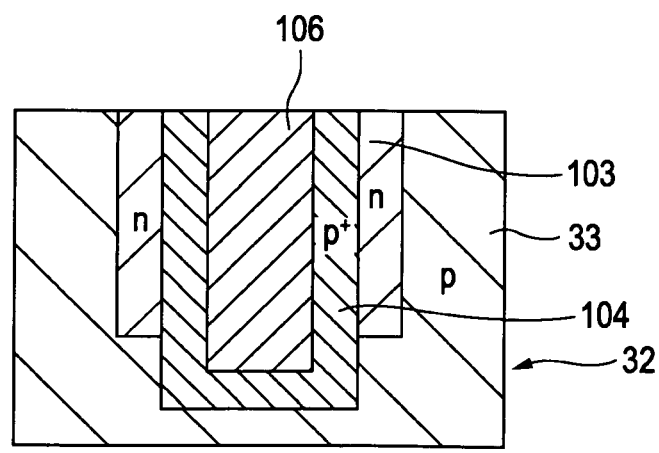

Referring then to FIG. 23C, a p-type impurity, for example, boron (B), is diffused by vapor phase diffusion or liquid phase diffusion through the trench 102 to its surrounding region. As a result, a p-type semiconductor region 104 surrounding the trench 102 is formed in the n-type semiconductor region 103. The p-type semiconductor region 104 is formed continuously along the inner walls and the bottom of the trench 102 so as to surround the trench 102. The n-type semiconductor region 103 is thus provided to be separated to the left and the right by the trench 102.

The trench 102 is then filled with, for example, a silicon dioxide ($SiO_2$) film 106 and subsequently the insulation film 88 is stripped. With the production method having been described, the photodiode 215 shown in FIGS. 8 and 9 can be formed.

In the embodiments described above, the p-type semiconductor well region 33 is used as a semiconductor well region. Alternatively, an n-type semiconductor well region having a low impurity concentration may also be used. Either semiconductor well region may be used as long as a transfer gate region is brought into the OFF state and additional ion implantation is used to facilitate transfer of charge, which is the same as in existing designs.

The above-described solid state imaging devices according to the third to ninth embodiments are top-surface-light-receiving-type solid state imaging devices. Alternatively, the present invention is also applicable to bottom-surface-light-receiving-type solid state imaging devices. The above-described solid state imaging devices of the embodiments are advantageously used as bottom-surface-light-receiving-type solid state imaging devices. In particular, the sixth embodiment shown in FIGS. 8 and 9 are advantageously used for bottom-surface-light-receiving-type solid state imaging devices. When a bottom-surface-light-receiving-type solid state imaging device is produced, as shown in FIG. 3A, its photodiode is directed to the bottom surface of a semiconductor substrate and a p-type semiconductor region for suppressing dark current is formed in the bottom surface of the semiconductor substrate.

In the embodiments described above, electrons are used as signal charge. Alternatively, holes may also be used as signal charge. In this case, the conductivity types of the semiconductor regions are respectively reversed from those in the embodiments described above.

Embodiment of Electronic Apparatus

Solid state imaging devices according to embodiments of the present invention are applicable to electronic apparatuses such as cameras including solid state imaging devices, camera-equipped mobile apparatuses, and other apparatuses including solid state imaging devices.

Figure 24:
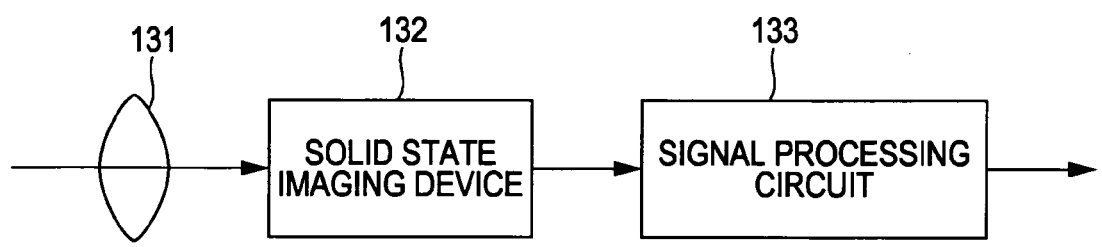
FIG. 24 shows the schematic configuration of an electronic apparatus according to an embodiment of the present invention.

FIG. 24 shows a camera serving as an example of an electronic apparatus according to an embodiment of the present invention. A camera 130 according to an embodiment of the present invention includes an optical system (optical lens) 131, a solid state imaging device 132, and a signal processing circuit 133. The solid state imaging device 132 is any one of the solid state imaging devices described in the embodiments above. The optical system 131 is configured to form an image with light (incoming light) from a subject on the imaging plane of the solid state imaging device 132. As a result, signal charge is accumulated for a period of time in the photoelectric conversion element of the solid state imaging device 132. The signal processing circuit 133 subjects signals output from the solid state imaging device 132 to various signal processing and outputs the resultant signals. The camera 130 of this embodiment encompasses a camera module in which the optical system 131, the solid state imaging device 132, and the signal processing circuit 133 are modularized.

The present invention can provide the camera shown in FIG. 24, camera-equipped mobile apparatuses represented by cellular phones including camera modules, and the like.

The configuration shown in FIG. 24 can also be provided as a module having an imaging function in which the optical system 131, the solid state imaging device 132, and the signal processing circuit 133 are modularized, that is, an imaging module. The present invention can provide electronic apparatuses including such imaging modules.

This embodiment can provide an electronic apparatus in which the saturation amount of charge in photoelectric conversion can be increased even when pixels having a reduced size are used in solid state imaging devices; a sufficiently wide dynamic range is provided; and higher image quality is provided.

The present application contains subject matter related to that disclosed in Japanese Priority Patent Application JP 2008-173626 filed in the Japan Patent Office on Jul. 2, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid state imaging device comprising:
a p-type well region in direct physical contact with a $p^+$-type semiconductor region and an $n^+$-type floating diffusion portion, a portion of the p-type well region being between said $p^+$-type semiconductor region and said $n^+$-type floating diffusion portion;
a $p^+$-type first vertically elongated region in direct physical contact with said $p^+$-type semiconductor region and an n-type vertically elongated region, said n-type vertically elongated region being in direct physical contact with said p-type well region and said $p^+$-type first vertically elongated region;
an insulation film in direct physical contact with said $p^+$-type first vertically elongated region and said $p^+$-type semiconductor region, said p-type well region and said $n^+$-type floating diffusion portion being in direct physical contact with said insulation film;

a p+-type bottom surface region in direct physical contact with said n-type vertically elongated region and said p+-type first vertically elongated region, said p+-type bottom surface region being configured to transfer incident light to said n-type vertically elongated region, wherein an impurity concentration of an n-type conductivity in the n-type vertically elongated region is substantially the same throughout the entirety of said n-type vertically elongated region, wherein an impurity concentration of a p-type conductivity in the p+-type first vertically elongated region is higher than an impurity concentration of the p-type conductivity in the p-type well region, wherein more of a signal charge is accumulable in a pn junction between said n-type vertically elongated region and said p+-type first vertically elongated region than in a pn junction between said n-type vertically elongated region and said p+-type semiconductor region, and the shape of potential is provided such that charges are mainly accumulated in a vertical direction.

2. The solid state imaging device according to claim 1, wherein said impurity concentration of the p-type conductivity in the p+-type first vertically elongated region is substantially the same throughout the entirety of said p+-type first vertically elongated region.

3. The solid state imaging device according to claim 1, wherein said impurity concentration of the p-type conductivity in the p-type well region is lower than an impurity concentration of the p-type conductivity in the p+-type bottom surface region.

4. The solid state imaging device according to claim 1, wherein an impurity concentration of the p-type conductivity in the p+-type semiconductor region is higher than said impurity concentration of the p-type conductivity in the p-type well region.

5. The solid state imaging device according to claim 1, wherein said insulation film and said p+-type bottom surface region are at opposite surfaces of a semiconductor substrate.

6. The solid state imaging device according to claim 1, wherein said n-type vertically elongated region is in direct physical contact with said p+-type semiconductor region.

7. The solid state imaging device according to claim 1, wherein said n-type vertically elongated region is between said p+-type first vertically elongated region and said p-type well region.

8. The solid state imaging device according to claim 1, wherein said p+-type first vertically elongated region is between said p+-type bottom surface region and said insulation film.

9. The solid state imaging device according to claim 1, wherein said p-type well region is between said p+-type bottom surface region and said insulation film.

10. The solid state imaging device according to claim 1, wherein said n-type vertically elongated region is between said p+-type bottom surface region and said p+-type semiconductor region.

11. The solid state imaging device according to claim 1, wherein said p+-type semiconductor region is between said n-type vertically elongated region and said insulation film.

12. The solid state imaging device according to claim 1, wherein said p-type well region is in direct physical contact with said p+-type bottom surface region.

13. The solid state imaging device according to claim 1, wherein a portion of the insulation film is between a transfer gate electrode and said portion of the p-type well region.

14. The solid state imaging device according to claim 1, wherein said n-type vertically elongated region is configured to accumulate said signal charge.

15. The solid state imaging device according to claim 1, wherein a photodiode comprises said p+-type first vertically elongated region, said n-type vertically elongated region and said p+-type semiconductor region.

16. The solid state imaging device according to claim 15, wherein said photodiode is configured to convert said incident light into said signal charge.

* * * * *